United States Patent
Tanaka et al.

(10) Patent No.: US 7,663,891 B2
(45) Date of Patent: Feb. 16, 2010

(54) COMPONENT MOUNTING BOARD STRUCTURE AND PRODUCTION METHOD THEREOF

(75) Inventors: Hirokazu Tanaka, Otsu (JP); Hiroyuki Ishibashi, Kyotanabe (JP)

(73) Assignee: Omron Corporation, Kyoto-Shi (JP)

( * ) Notice: Subject to any disclaimer, the term of this patent is extended or adjusted under 35 U.S.C. 154(b) by 819 days.

(21) Appl. No.: 11/431,097

(22) Filed: May 10, 2006

(65) Prior Publication Data

US 2006/0268527 A1  Nov. 30, 2006

(30) Foreign Application Priority Data

May 13, 2005  (JP)  ............................ P2005-141748
Apr. 24, 2006  (JP)  ............................ P2006-118733

(51) Int. Cl.
H05K 7/00 (2006.01)
(52) U.S. Cl. ........................ 361/760; 361/761; 361/762; 361/763
(58) Field of Classification Search ................. 361/760, 361/761, 762, 763; 174/250, 261
See application file for complete search history.

(56) References Cited

U.S. PATENT DOCUMENTS

| | | | |
|---|---|---|---|
| 4,843,520 A | 6/1989 | Nakatani et al. | |
| 6,205,028 B1 | 3/2001 | Matsumura | |
| 6,970,367 B2 * | 11/2005 | Takeshima et al. | 363/147 |
| 2003/0081389 A1 * | 5/2003 | Nair et al. | 361/764 |
| 2005/0052888 A1 * | 3/2005 | Takeshima et al. | 363/147 |
| 2005/0063651 A1 * | 3/2005 | Hamasaki et al. | 385/100 |
| 2005/0082646 A1 * | 4/2005 | Komoto et al. | 257/666 |
| 2006/0268522 A1 * | 11/2006 | Furuyama et al. | 361/709 |

FOREIGN PATENT DOCUMENTS

| | | | |
|---|---|---|---|
| EP | 1722612 A1 * | 11/2006 | |
| JP | 01 228193 | 12/1989 | |
| JP | 06 310888 | 3/1995 | |
| JP | 2005141748 A * | 6/2005 | |

OTHER PUBLICATIONS

European Search Report, dated Sep. 13, 2006, 9 pages.

* cited by examiner

Primary Examiner—Dean A. Reichard
Assistant Examiner—Abiy Getachew
(74) Attorney, Agent, or Firm—Foley & Lardner LLP

(57) ABSTRACT

In a lead frame board, while a heat radiation wall member formed by a resin having a relatively high thermal conductivity is provided in a low heat-resistance heat generating component mounting region where a low heat-resistance heat generating component is mounted, heat block wall members formed by resins having relatively low thermal conductivities are provided in a high heat-resistance heat generating component mounting region where a high heat-resistance heat generating component is mounted and in a non-heat generating component mounting region where a non-heat generating component is mounted. Thus, heat block is performed between the low heat-resistance heat generating component mounting region and the high heat-resistance heat generating component mounting region and non-heat generating component mounting region, and a heat radiation function is enhanced in the low heat-resistance heat generating component.

25 Claims, 10 Drawing Sheets

| | |
|---|---|
| 1 | Lead frame board (component mounting board) |
| 4 | Heat generating component |
| 4A | Low heat-resistance heat generating component |
| 4B | High heat-resistance heat generating component |
| 5 | Non-heat generating component |
| 5A | Low heat-resistance non-heat generating component |
| 5B | High heat-resistance non-heat generating component |
| 7 | Low heat-resistance heat generating component mounting region |
| 8 | High heat-resistance heat generating component mounting region |
| 9 | Non-heat generating component mounting region |
| 10 | Radiation member layer |
| 11 | Heat block member layer |

Fig. 1

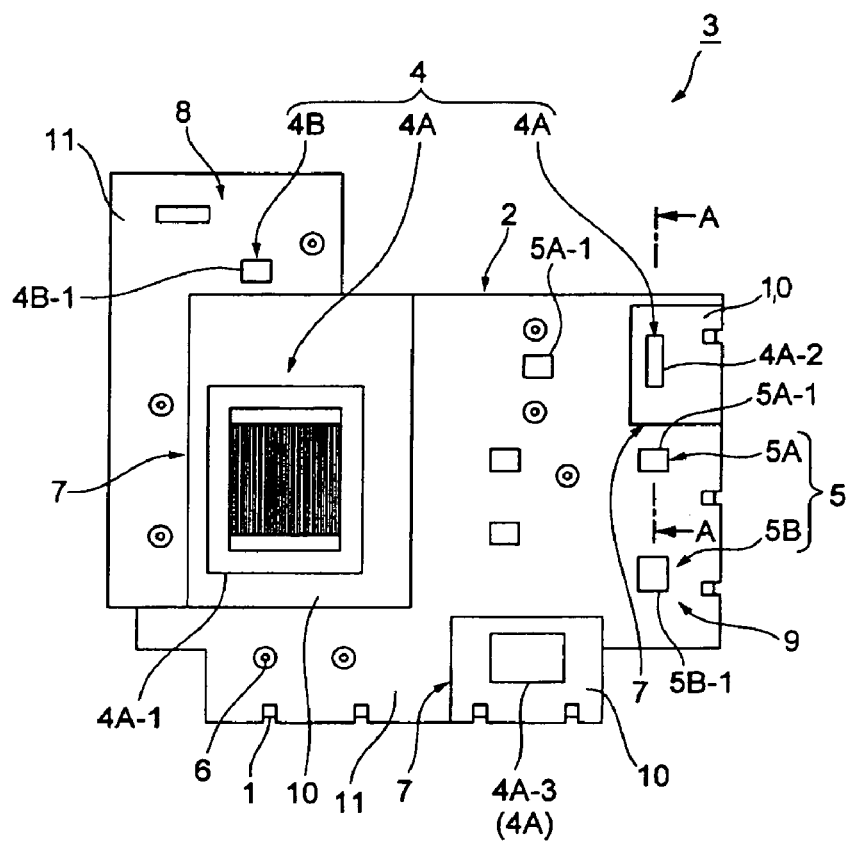

| 1 | Lead frame board (component mounting board) | 7 | Low heat-resistance heat generating component mounting region |
| 4 | Heat generating component | 8 | High heat-resistance heat generating component mounting region |
| 4A | Low heat-resistance heat generating component | 9 | Non-heat generating component mounting region |
| 4B | High heat-resistance heat generating component | 10 | Radiation member layer |
| 5 | Non-heat generating component | 11 | Heat block member layer |
| 5A | Low heat-resistance non-heat generating component | | |
| 5B | High heat-resistance non-heat generating component | | |

Electronic device housing

COMPONENT MOUNTING BOARD STRUCTURE AND PRODUCTION METHOD THEREOF

BACKGROUND OF THE INVENTION

1. Field of the Invention

The present invention relates to a component mounting board structure having a heat radiation or heat block function and a production method thereof. The component mounting board structure is configured such that heat generated from a heat generating component, e.g., a heat generating element of an electronic device such as a switching regulator and a thermoregulator is efficiently radiated while does not have an influence on other components through a component mounting board.

2. Description of the Related Art

Recently, in the electronic devices such as the thermoregulator, development focuses on high functionality. However, heat radiation measures obstruct miniaturization and high performance of the electronic device.

In the heat radiation measures of the electronic device, there is a problem that electric power consumption of the electronic device is increased due to the high functionality of the electronic device, and thereby a temperature of an electronic component is increased to exceed a heat-resistant limitation temperature of the electronic component, namely, the temperature of the electronic component is increased not to be able to exert predetermined performance. From the standpoint of a demand of the miniaturization of the electronic device, there is also another problem that, because the same amount of heat is required to be radiated in an area smaller than ever, the heat is easy to accumulate in the device and thereby the temperature of the electronic component is increased to exceed the heat-resistant limitation temperature of the electronic component.

In the electronic devices such as the thermoregulator, plural components having large heat generation amounts are used in a power supply portion, though the power supply portion generates the largest heat generation amount. In order to eliminate the influence of the heat between components, it is necessary to increase a distance between components. Therefore, it is difficult to achieve the miniaturization of the electronic component. Further, because the heat radiation measures are achieved to all the plural components having large heat generation amounts, a production process becomes complicated, which obstructs improvement of production efficiency.

Therefore, in order to eliminate the influence of the heat generated by the heat generating component on other mounting components, there is a problem that heat block on a component mounting board is efficiently achieved while the miniaturization is realized. Under the situation that the modularization of the component mounting board is widely performed, in modularizing the component mounting board, it is necessary to develop the component mounting board from the viewpoint of controlling a heat radiation function.

Currently, in the case where the electronic components are mounted on the component mounting board and used in modules, a printed wiring board and lead frame board are frequently used as the component mounting board.

As is well known, the printed wiring board has a structure in which a metal thin plate formed by a copper plate or the like is laminated on a surface of resin board made of one kind of resin and a circuit pattern and the like are printed on the metal thin plate.

In the conventional heat generating component (heat generating element) in which the printed wiring board is used, there is a radiation structure in which the heat generated from the individual heat generating element is separately radiated through each radiator by providing the radiator in each heat generating component mounted on the printed wiring board.

For example, in the electronic component mounting, a through hole and plural screw holes are made in the printed wiring board, the heat generating element is mounted on one of surfaces of the printed wiring board corresponding to the through hole, a projection portion having a perforation and a screw locking hole are provided in the radiator, the projection portion is inserted into the through hole to arrange the radiator in printed wiring board corresponding to the position of the heat generating component, the screw inserted through the screw hole is fixed in the screw locking hole to attach the radiator to the printed wiring board, and a gap between the projection and an element package of the heat generating element is filled with a thermally conductive adhesive through the perforation using a syringe (for example, refer to Japanese Utility Model Application Laid-Open No. H06-45393).

The lead frame board in itself is formed by the metal thin plate such as the copper plate and an aluminum plate. The metal thin plate is punched to integrally provide a circuit pattern and a connection terminal by a pressing machine, the mounting components are soldered onto the circuit pattern, and the circuit pattern and the mounting component are sealed by an insulating resin layer made of one kind of insulating resin.

In the conventional heat generating component (heat generating element) in which the lead frame board is used, there is a radiation structure in which, while the high heat radiation function of the lead frame board is utilized to enhance the heat radiation function, similarly to the printed wiring board, the heat generated from the individual heat generating element is separately radiated through each radiator by providing the radiator in each heat generating component mounted on the lead frame board if needed (for example, refer to Japanese Patent Application Laid-Open Nos. 2003-347509 and 2003-243562).

Accordingly, in the configuration of the conventional techniques, both in the printed wiring board formed based on the resin board and in the lead frame board formed by sealing the circuit pattern and the mounting component with the insulating resin, the gap between the circuit patterns is insulated using one kind of resin, the heat generating components which generate the heat by themselves are treated irrespective of the different heat generating temperatures, and only the radiator is separately provided in each heat generating component to separately radiate the heat generated by the heat generating component using each radiator.

However, for the heat radiation problem of the electronic device having the configuration in which the mounting components are mounted on the component mounting board, it is necessary to manage design such that the temperature of the heat generating component does not exceed a heat-resistant limitation temperature of the heat generating component in consideration of the heat generated by each heat generating component. In addition, it is necessary to consider the following situation in order to completely solve the heat radiation problem.

That is, it is necessary to consider that the heat generated by the heat generating component has an influence not only on itself but on other mounting components.

In consideration of the above, for example, in the conventional techniques, there is known a technique in which a mounting area for the electronic components such as CPU having the large heat generating amount in the component mounting board and a mounting area where an imaging optical system and a solid-state imaging device are mounted are separated from each other by a notch, a metal member is inserted into the notch, and thereby the heat from the electronic components such as CPU is absorbed and radiated by the metal member inserted into the notch. There is also known a technique in which an electronic device housing is divided into a matrix, simple computation is performed by substituting attribute values (degree of heat generation, heat resistance, and criticality) for incorporated substances, and the result is compared to past successful records to determine arrangement of the incorporated substances in the electronic device housing (for example, refer to Japanese Patent Application Laid-Open Nos. H8-237525 and H9-230963).

However, in the conventional techniques, the arrangements of the heat generating component and the non-heat generating electronic component are designed on the component mounting board or in the electronic device housing by separating the heat generating component and the non-heat generating electronic component. That is, the mounting components having the functional correlations with one another are arranged in separate mounting areas in the component mounting board or electronic device housing, because mounting components differ from one another in the thermal property. Accordingly, in order to respond to the current demand of the high-density packaging, it is obvious that the conventional technique has a limitation.

In the conventional technique, the heat generating component is individually treated, and the radiation structure is formed for each heat generating component. Therefore, in the case where the heat generating components are collectively mounted in one area, it is not considered that the heat generated by one heat generating component has an influence on other heat generating components through the component mounting board.

The inventors do not focus on the heat radiation measures according to the arrangements of the mounting components mounted on the component mounting board, but the inventors focus on separate treatment of the heat generating component and the non-heat generating component. The heat generating component largely generates the heat by itself, namely, the heat generating component has a large self-heating characteristic. The non-heat generating component has no self-heating characteristic or hardly has the self-heating characteristic. The inventors also focus on a difference in heat-resistant limitation temperatures among the heat generating components and the non-heat generating components depending on the characteristics of the heat generating components and non-heat generating components.

The heat generating component is divided into a low heat-resistance heat generating component and a high heat-resistance heat generating component. The non-heat generating component is divided into a low heat-resistance non-heat generating component and a high heat-resistance heat generating component. In the radiation structure of the heat generating component, not only it should be considered that the heat generated by the heat generating component is not radiated only by the radiator individually provided in the heat generating component unlike the conventional technique, but also it should be considered that the heat generated by the high heat-resistance heat generating component has an influence on the low heat-resistance heat generating component through the component mounting board or the heat generated by the low heat-resistance heat generating component has an influence on the low heat-resistance non-heat generating component through the component mounting board.

In the case where the printed wiring board is used as the component mounting board formed by the high-density packaging, particularly in the case where the lead frame board is used as the component mounting board, the heat generated by the heat generating component is transferred to the lead frame board, so that the heat is easy to have an influence on other mounting components.

In view of the foregoing, an object of the invention is to provide a component mounting board structure having a heat radiation function or a heat block function. In the component mounting board structure, the mounting components mounted on the component mounting board are divided into the heat generating component and the non-heat generating component by distinguishing the heat generating components having large self-heating characteristics from the non-heat generating components having no self-heating characteristic or hardly having self-heating characteristics, the heat generating components are also divided according to the heat-resistant limitation temperatures, and thus various kinds of mounting components are separately treated. That is, the low heat-resistance heat generating component on which the heat has the largest influence is not affected by the heat generated by itself, the heat generated by the low heat-resistance heat generating component does not have an influence on the non-heat generating component, the heat generated by the high heat-resistance heat generating component does not have an influence on the low heat-resistance heat generating component, and the heat generated by the heat generating component, particularly by the low heat-resistance heat generating component is radiated by efficiently leading the heat to a point where the heat does not have an influence on neighbors, or the transferred heat is blocked, thereby suppressing the temperatures of all the mounting components to the heat-resistant limitation temperature or less.

Another object of the invention is to provide a method of producing a component mounting board structure having a versatile radiation structure according to the component mounting boards such as the printed wiring board and the lead frame board. In the component mounting board structure production method, the component mounting board structure is produced at low cost and improvement of assembling productivity is achieved. In the component mounting board structure, the mounting components mounted on the component mounting board are divided into the heat generating component and the non-heat generating component by distinguishing the heat generating components having large self-heating characteristics from the non-heat generating components having no self-heating characteristic or hardly having self-heating characteristics, the heat generating components are also divided according to the heat-resistant limitation temperatures, and thus various kinds of mounting components are separately treated. That is, the low heat-resistance heat generating component on which the heat has the largest influence is not affected by the heat generated by itself, the heat generated by the low heat-resistance heat generating component does not have an influence on the non-heat generating component, the heat generated by the high heat-resistance heat generating component does not have an influence on the low heat-resistance heat generating component, and the heat generated by the heat generating component, particularly by the low heat-resistance heat generating component is radiated by efficiently leading the heat to a point where the heat does not have an influence on neighbors, thereby suppressing the temperatures of all the mounting components to the heat-resistant limitation temperature or less.

SUMMARY OF THE INVENTION

In order to achieve the first object, a first aspect of the invention is a component mounting board structure, wherein mounting components mounted on a component mounting board are formed by heat generating components having large self-heating characteristics and non-heat generating components having no self-heating characteristic or hardly having self-heating characteristics, the heat generating components are divided into a low heat-resistance heat generating component and a high heat-resistance heat generating component according to heat-resistant limitation temperatures, the non-heat generating components are divided into a low heat-resistance non-heat generating component and a high heat-resistance non-heat generating component according to heat-resistant limitation temperatures, and heat radiation or heat block is performed by interposing resin layers among a low heat-resistance heat generating component mounting region where the low heat-resistance heat generating component is mounted, a high heat-resistance heat generating component mounting region where the high heat-resistance heat generating component is mounted, a low heat-resistance non-heat generating component mounting region where the low heat-resistance non-heat generating component is mounted, and a high heat-resistance non-heat generating component mounting region where the high heat-resistance non-heat generating component is mounted.

In accordance with the first aspect of the invention, the heat radiation or heat block is performed with the resin among the low heat-resistance heat generating component mounting region, the high heat-resistance heat generating component mounting region, the low heat-resistance non-heat generating component mounting region, and the high heat-resistance non-heat generating component mounting region. Therefore, the resin functions not only as the radiation member layer but also as the heat block layer, and a small heat amount generated by the low heat-resistance heat generating component is transferred to the component mounting board. However, the heat transferred to the component mounting board can be radiated by efficiently inducing the heat to a point where the heat has no influence on the neighbors such as the electronic device housing, and particularly the heat never has an influence on the low heat-resistance non-heat generating component.

In a component mounting board structure according to a second aspect of the invention, the low heat-resistance heat generating component of the first aspect is formed by a transistor, a diode, a thermistor, a transformer, and a coil which are of a component having an electric power consumption not lower than 1 W and a low heat-resistant limitation temperature. In a component mounting board structure having the heat radiation function according to a third aspect of the invention, the high heat-resistance heat generating component of the first aspect is formed by a chip type resistor which is of a component having an electric power consumption not more than 0.5 W and a high heat-resistant limitation temperature. In a component mounting board structure having the heat radiation function according to a fourth aspect of the invention, the low heat-resistance non-heat generating component of the first aspect is formed by an aluminum electrolytic capacitor which is of a component having a low heat-resistant limitation temperature, the aluminum electrolytic capacitor being required to be used in a low temperature environment. In a component mounting board structure having the heat radiation function according to a fifth aspect of the invention, the high heat-resistance non-heat generating component of the first aspect is formed by a chip type capacitor which is of a component having a high heat-resistant limitation temperature.

In accordance with the second to fifth aspects of the invention, the components can be mounted on the component mounting board while clearly divided into the low heat-resistance heat generating component, the high heat-resistance heat generating component, the low heat-resistance non-heat generating component, and the high heat-resistance non-heat generating component. Therefore, the heat radiation or heat block can securely be performed with the resin, and the resin material can easily be selected.

In a component mounting board structure according to a sixth aspect of the invention, the resin layer as in any one of the first to fifth aspects is formed by a radiation member layer and heat block member layer.

In accordance with the sixth aspect of the invention, while the heat generated from the mounting component can securely be radiated by the radiation member layer, the heat transferred from other components can securely blocked by the heat block member layer.

In a component mounting board structure according to a seventh aspect of the invention, the radiation member layer of the sixth aspect is made of a resin whose thermal conductivity ranges from 0.8 to 6.0 W/mK. In a component mounting board structure having the heat radiation function according to an eighth aspect of the invention, the radiation member layer of the sixth aspect is made of a resin whose thermal conductivity ranges from 1.5 to 6.0 W/mK. In a component mounting board structure according to a ninth aspect of the invention, the heat block member layer of the sixth aspect is made of a resin whose thermal conductivity ranges from 0.1 to 0.8 W/mK. In a component mounting board structure according to a tenth aspect of the invention, the heat block member layer of the sixth aspect is made of a resin whose thermal conductivity ranges from 0.1 to 0.5 W/mK.

In accordance with the seventh to tenth aspect of the invention, because the thermal conductivities are specifically numerically set in the radiation member layer and the heat block member layer, the resin materials can easily and clearly selected. Therefore, the heat generated from the mounting component can securely be radiated by the radiation member layer, and the heat transferred from other components can securely blocked by the heat block member layer.

In a component mounting board structure according to an eleventh aspect of the invention, in any one of the first to tenth aspect, a radiation member layer made of a resin having a relatively high thermal conductivity is provided in the low heat-resistance heat generating component mounting region, and the heat radiation or heat block is performed by the radiation member layer among the low heat-resistance heat generating component mounting region, the high heat-resistance heat generating component mounting region, the low heat-resistance non-heat generating component mounting region, and the high heat-resistance non-heat generating component mounting region.

In accordance with the eleventh aspect of the invention, the heat generated by the low heat-resistance heat generating component is efficiently radiated by the radiation member layer, which causes the heat not to have an influence on the low heat-resistance non-heat generating component and high heat-resistance non-heat generating component or the high heat-resistance heat generating component.

In a component mounting board structure according to a twelfth aspect of the invention, a radiation member layer made of a resin having a relatively high thermal conductivity is provided in the low heat-resistance heat generating component mounting region as in any one of the first to tenth aspects, heat block member layers made of resins having relatively low thermal conductivities are provided in the high heat-resistance heat generating component mounting region, the low heat-resistance non-heat generating component mounting region, and the high heat-resistance non-heat generating component mounting region, and the heat radiation or heat block is performed by the radiation member layer and the heat block member layer among the low heat-resistance heat generating component mounting region, the high heat-resistance heat generating component mounting region, the low heat-resistance non-heat generating component mounting region, and the high heat-resistance non-heat generating component mounting region.

In accordance with the twelfth aspect of the invention, the heat generated by the low heat-resistance heat generating component is efficiently radiated by the radiation member layer, which causes the heat not to have an influence on the low heat-resistance non-heat generating component and high heat-resistance non-heat generating component or the high heat-resistance heat generating component. At the same time, the excessive heat which the radiation member layer cannot radiate is blocked by the heat block member layer, which causes the heat not to have an influence on the low heat-resistance non-heat generating component and high heat-resistance non-heat generating component or the high heat-resistance heat generating component.

In a component mounting board structure according to a thirteenth aspect of the invention, a radiation member layer made of a resin having a relatively high thermal conductivity is provided in the low heat-resistance heat generating component mounting region as in any one of the first to tenth aspects, a heat block member layer made of a resin having a relatively low thermal conductivity is provided in the low heat-resistance non-heat generating component mounting region, and the heat radiation or heat block is performed by the radiation member layer and the heat block member layer among the low heat-resistance heat generating component mounting region, the high heat-resistance heat generating component mounting region, the low heat-resistance non-heat generating component mounting region, and the high heat-resistance non-heat generating component mounting region.

In accordance with the thirteenth aspect of the invention, the heat generated by the low heat-resistance heat generating component is efficiently radiated by the radiation member layer, which causes the heat not to have an influence on the low heat-resistance non-heat generating component or the high heat-resistance non-heat generating component. At the same time, the excessive heat which the radiation member layer cannot radiate is blocked by the heat block member layer, which causes the heat not to have an influence on the low heat-resistance non-heat generating component.

In a component mounting board structure according to a fourteenth aspect of the invention, radiation member layers made of resins having relatively high thermal conductivities are provided in the low heat-resistance heat generating component mounting region and high heat-resistance heat generating component mounting region as in any one of the first to tenth aspects, heat block member layers made of resins having relatively low thermal conductivities are made in the low heat-resistance non-heat generating component mounting region and the high heat-resistance non-heat generating component mounting region, and the heat radiation or heat block is performed by the radiation member layer and the heat block member layer among the low heat-resistance heat generating component mounting region, the high heat-resistance heat generating component mounting region, the low heat-resistance non-heat generating component mounting region, and the high heat-resistance non-heat generating component mounting region.

In accordance with the fourteenth aspect of the invention, the heat generated by the low heat-resistance heat generating component and the high heat-resistance heat generating component is efficiently radiated by the radiation member layer, which causes the heat not to have an influence on the low heat-resistance non-heat generating component and the high heat-resistance non-heat generating component. At the same time, the excessive heat which the radiation member layer cannot radiate is blocked by the heat block member layer, which causes the heat not to have an influence on the low heat-resistance non-heat generating component and the high heat-resistance non-heat generating component.

In a component mounting board structure according to a fifteenth aspect of the invention, radiation member layers made of resins having relatively high thermal conductivities are provided in the low heat-resistance heat generating component mounting region and high heat-resistance heat generating component mounting region as in any one of the first to tenth aspects, a heat block member layer made of a resin having a relatively low thermal conductivity is provided in the low heat-resistance non-heat generating component mounting region, and the heat radiation or heat block is performed by the radiation member layer and the heat block member layer between the low heat-resistance heat generating component mounting region and the high heat-resistance heat generating component mounting region and between the low heat-resistance non-heat generating component mounting region and the high heat-resistance non-heat generating component mounting region.

In accordance with the fifteenth aspect of the invention, the heat generated by the low heat-resistance heat generating component and the high heat-resistance heat generating component is efficiently radiated in a large area by the radiation member layer, which causes the heat not to have an influence on the low heat-resistance non-heat generating component and the high heat-resistance non-heat generating component. At the same time, the excessive heat which the radiation member layer cannot radiate is blocked by the heat block member layer, which causes the heat not to have an influence on the low heat-resistance non-heat generating component.

In a component mounting board structure according to a sixteenth aspect of the invention, the radiation member layer and the heat block member layer are arranged on the component mounting board while a gap exists between the radiation member layer and the heat block member layer.

In accordance with the sixteenth aspect of the invention, the gap is located between the radiation member layer and the heat block member layer on the component mounting board. Therefore, the heat block is secured between the radiation member layer and the heat block member layer, which allows the low heat-resistance heat generating component to be protected from the influence of the heat generated by the high heat-resistance heat generating component.

In a component mounting board structure according to a seventeenth aspect of the invention, the radiation member layer as in any one of the sixth to sixteenth aspects is closely arranged in an electronic device housing which accommodates the component mounting board.

In accordance with the seventeenth aspect of the invention, the component mounting board structure exerts the function of diffusing the heat transferred to the radiation member layer through the electronic device housing having large heat capacity, so that the heat generated by the low heat-resistance heat generating component can be radiated by efficiently inducing the heat through the electronic device housing to a point where the heat has no influence on the neighbors.

In a component mounting board structure according to an eighteenth aspect of the invention, a radiator plate which is formed separately from the radiation member layer is provided in a region corresponding to the radiation member layer as in any one of the sixth to seventeenth aspects.

In accordance with the eighteenth aspect of the invention, not only the heat transferred to the radiation member layer from the heat generating component is radiated by the radiation member layer, but also the heat is radiated into air through the radiator plate which is provided in the component mounting board corresponding to the radiation member layer, so that higher radiation effect is obtained.

In a component mounting board structure according to a nineteenth aspect of the invention, the radiator plate of the eighteenth aspect is formed so as to have a surface area according to a heat generating amount of heat generating component.

In accordance with the nineteenth aspect of the invention, the high radiation effect is obtained because the radiator plate is selected according to the heat generating amount of the heat generating component.

In a component mounting board structure according to a twentieth aspect of the invention, the radiator plate of the eighteenth or nineteenth aspects has a radiation fin.

In accordance with the twentieth aspect of the invention, not only the heat generated by the plural heat generating components is radiated by the radiation member layer, but also the heat is radiated into air through the radiation fin which is provided in the component mounting board corresponding to the radiation member layer, so that higher radiation effect is obtained.

In a component mounting board structure according to a twenty-first aspect of the invention, the radiator plate as in any one of the eighteenth to twentieth aspects is integrally formed with the radiation member layer.

In accordance with the twenty-first aspect of the invention, the radiator plate can simultaneously be formed in the process of forming the radiation member layer on the component mounting board, which contributes to the improvement of productivity.

In order to achieve the second object, a twenty-second aspect of the invention is a component mounting board structure production method, wherein, in the case where mounting components mounted on a component mounting board are formed by heat generating components and non-heat generating components while the heat generating components are divided into a low heat-resistance heat generating component and a high heat-resistance heat generating component according to heat-resistant limitation temperatures, when the low heat-resistance heat generating component mounting region and high heat-resistance heat generating component mounting region or the non-heat generating component mounting region are formed while heat radiation or heat block is performed by a radiation member layer and a heat block member layer, the radiation member layer made of a resin having a relatively high thermal conductivity being provided in a low heat-resistance heat generating component mounting region where the low heat-resistance heat generating component is mounted in the component mounting board, the heat block member layer made of a resin having a relatively low thermal conductivity being provided in a high heat-resistance heat generating component mounting region where the high heat-resistance heat generating component is mounted or in a non-heat generating component mounting region where the non-heat generating component is mounted in the component mounting board, the radiation member layer is formed by laminating the resin having the relatively high thermal conductivity in the low heat-resistance heat generating component mounting region of the component mounting board, and then the heat block member layer is formed by laminating the resin having the relatively low thermal conductivity in the high heat-resistance heat generating component mounting region of the component mounting board, and thereby the radiation member layer and the heat block member layer are made on the component mounting board.

In accordance with the twenty-second aspect of the invention, the heat radiation or heat block structure can be produced at low cost according to the component mounting board while the assembling productivity can be improved, and the component mounting board structure having the heat radiation or heat block structure can be produced at low cost.

In order to achieve the second object, a twenty-third aspect of the invention is a component mounting board structure production method, wherein, in the case where mounting components mounted on a component mounting board are formed by heat generating components and non-heat generating components while the heat generating components are divided into a low heat-resistance heat generating component and a high heat-resistance heat generating component according to heat-resistant limitation temperatures, when the low heat-resistance heat generating component mounting region and high heat-resistance heat generating component mounting region or the non-heat generating component mounting region is formed while heat radiation or heat block is performed by a radiation member layer and a heat block member layer, the radiation member layer made of a resin having a relatively high thermal conductivity being provided in a low heat-resistance heat generating component mounting region where the low heat-resistance heat generating component is mounted in the component mounting board, the heat block member layer made of a resin having a relatively low thermal conductivity being provided in a high heat-resistance heat generating component mounting region where the high heat-resistance heat generating component is mounted or in a non-heat generating component mounting region where the non-heat generating component is mounted in the component mounting board, the heat block member layer is formed by applying the resin having the relatively low thermal conductivity to the high heat-resistance heat generating component mounting region of the component mounting board, and then the radiation member layer is formed by applying the resin having the relatively high thermal conductivity to the low heat-resistance heat generating component mounting region of the component mounting board, and thereby the radiation member layer and the heat block member layer are made on the component mounting board.

In accordance with the twenty-third aspect of the invention, the heat radiation or heat block structure can be produced at low cost according to the component mounting board while the assembling productivity can be improved, and the component mounting board structure having the heat radiation or heat block structure can be produced at low cost.

In order to achieve the second object, a twenty-fourth aspect of the invention is a component mounting board structure production method, wherein, in the case where mounting components mounted on a component mounting board are formed by heat generating components and non-heat generating components while the heat generating components are divided into a low heat-resistance heat generating component and a high heat-resistance heat generating component according to heat-resistant limitation temperatures, when the low heat-resistance heat generating component mounting region and high heat-resistance heat generating component mounting region or the non-heat generating component mounting region is formed while heat radiation or heat block is performed by a radiation member layer and a heat block member layer, the radiation member layer made of a resin having a relatively high thermal conductivity being provided in a low heat-resistance heat generating component mounting region where the low heat-resistance heat generating component is mounted in the component mounting board, the heat block member layer made of a resin having a relatively low thermal conductivity being provided in a high heat-resistance heat generating component mounting region where the high heat-resistance heat generating component is mounted or in a non-heat generating component mounting region where the non-heat generating component is mounted in the component mounting board, the heat block member layer is formed in the high heat-resistance heat generating component mounting region of the component mounting board by injecting the resin having the relatively low thermal conductivity from one of nozzles of a molding machine to the high heat-resistance heat generating component mounting region of the component mounting board, at the same time when the radiation member layer is formed in the low heat-resistance heat generating component mounting region of the component mounting board by injecting the resin having the relatively high thermal conductivity from the other nozzle of the molding machine to the low heat-resistance heat generating component mounting region of the component mounting board.

In accordance with the twenty-fourth aspect of the invention, the heat radiation or heat block structure can be produced at low cost according to the component mounting board while the assembling productivity can be improved, and the component mounting board structure having the heat radiation or heat block structure can be produced at low cost.

In order to achieve the second object, a twenty-fifth aspect of the invention is a component mounting board structure production method, wherein, in the case where mounting components mounted on a component mounting board are formed by heat generating components and non-heat generating components while the heat generating components are divided into a low heat-resistance heat generating component and a high heat-resistance heat generating component according to heat-resistant limitation temperatures, when the low heat-resistance heat generating component mounting region and high heat-resistance heat generating component mounting region or the non-heat generating component mounting region is formed while heat radiation or heat block is performed by a radiation member layer and a heat block member layer, the radiation member layer made of a resin having a relatively high thermal conductivity being provided in a low heat-resistance heat generating component mounting region where the low heat-resistance heat generating component is mounted in the component mounting board, the heat block member layer made of a resin having a relatively low thermal conductivity being provided in a high heat-resistance heat generating component mounting region where the high heat-resistance heat generating component is mounted or in a non-heat generating component mounting region where the non-heat generating component is mounted in the component mounting board, after at least one of the low heat-resistance heat generating component mounting regions is surrounded by a low-cost mold, the radiation member layer is formed by filling the low heat-resistance heat generating component mounting region with the resin having the relatively high thermal conductivity.

In accordance with the twenty-fourth aspect of the invention, the heat radiation or heat block structure can be produced at low cost according to the component mounting board while the assembling productivity can be improved, and the component mounting board structure having the heat radiation or heat block structure can be produced at low cost.

In accordance with the component mounting board structure of the invention, the heat radiation or heat block is performed with the resin among the low heat-resistance heat generating component mounting region, the high heat-resistance heat generating component mounting region, the low heat-resistance non-heat generating component mounting region, and the high heat-resistance non-heat generating component mounting region. Therefore, the resin functions not only as the radiation member layer but also as the heat block layer, and a small heat amount generated by the low heat-resistance heat generating component is transferred to the component mounting board. However, the heat transferred to the component mounting board can be radiated by efficiently inducing the heat to a point where the heat has no influence on the neighbors such as the electronic device housing, and particularly the heat never has an influence on the low heat-resistance non-heat generating component.

In accordance with the component mounting board structure production method of the invention, the versatile component mounting board structure having the radiation or heat block structure can be produced at low cost according to the component mounting boards such as the printed wiring board and the lead frame board, and the assembling productivity can be improved.

BRIEF DESCRIPTION OF THE DRAWINGS

FIG. 1 shows a plan view showing an upper surface of a lead frame board in which an embodiment is adopted in a component mounting board structure according to the invention;

FIG. 14-1 shows a sectional view showing a main part of the lead frame board before a radiation member layer is formed in the lead frame board in Example 1 of the invention shown in FIG. 2;

FIG. 14-2 shows a sectional view showing the main part of the lead frame board in a process of forming the radiation member layer in the lead frame board shown in FIG. 14-1;

FIG. 15-1 shows a sectional view showing a main part of the lead frame board in which the radiation member layer and a heat block member layer are formed in the lead frame board in Example 3 of the invention shown in FIG. 4;

FIG. 15-2 shows a sectional view showing a main part of the lead frame board produced by the production method shown in FIG. 15-1;

FIG. 16-1 shows a sectional view showing a main part of the lead frame board before the radiation member layer is formed in the lead frame board in Example 3 of the invention shown in FIG. 4;

FIG. 16-2 shows an explanatory view showing a process of forming the radiation member layer in the lead frame board shown in FIG. 16-1; and FIG. 16-3 shows a sectional view showing a main part of the lead frame board produced by the process shown in FIG. 16-2.

DETAILED DESCRIPTION OF THE PREFERRED EMBODIMENTS

Preferred embodiments of the invention will be described below with reference to the accompanying drawings.

Figures 1, 14:
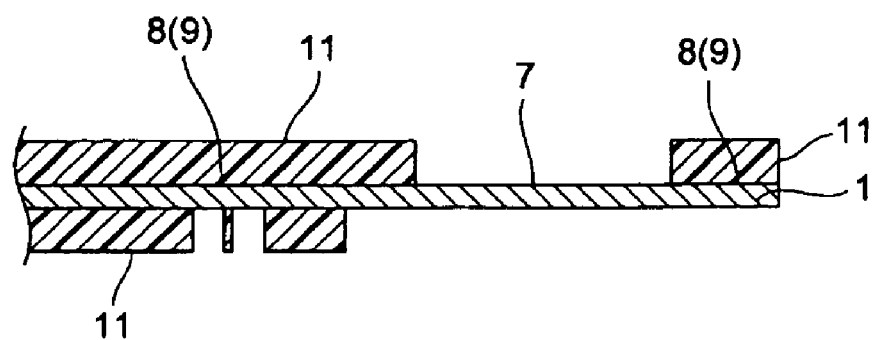
Figures 2, 14:
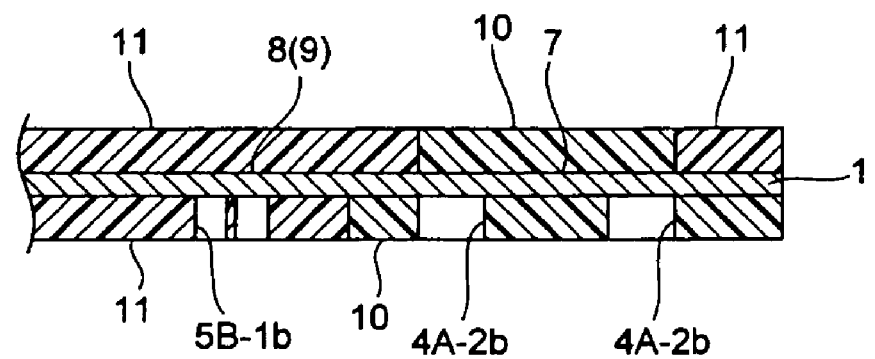

First a case where the embodiment of the invention is adopted for the lead frame board will be described with reference to FIG. 1. FIG. 1 is a plan view showing a lead frame board when viewed from a component mounting surface.

In FIG. 1, a lead frame board 1 is formed by punching a metal thin plate such as an aluminum plate or a copper plate in a circuit pattern shape, and a resin encapsulation board 3 is formed by mounting a mounting component including later-mentioned plural electronic components on the circuit pattern to encapsulate a part of the electronic component with an electrically insulating resin layer 2.

The mounting component includes a heat generating component 4 and a non-heat generating component 5. The heat generating component 4 has a large self-heating characteristic, and the non-heat generating component 5 has no self-heating characteristic or hardly has the self-heating characteristic.

The heat generating component 4 can be divided into a low heat-resistance heat generating component 4A and a high heat-resistance heat generating component 4B according to the difference of the heat-resistant limitation temperature. The low heat-resistance heat generating component 4A is a component having a strict temperature limitation, and the high heat-resistance heat generating component 4B is a component having a not-restricted temperature limitation. For a power supply circuit, examples of the low heat-resistance heat generating component 4A include a transformer 4A-1, a coil (not shown), and a semiconductor such as a transistor 4A-2 and an LSI circuit 4A-3. The transformer 4A-1 and the coil have the large electric power consumptions not lower than 1 W, and the transformer 4A-1 and the coil have heat-resistant temperatures of about 130° C. Junction portions of the transistor 4A-2 and LSI circuit 4A-3 have the heat-resistant temperatures of about 150° C. For the power supply circuit, a chip type resistor 4B-1 can be cited as an example of the high heat-resistance heat generating component 4B. The chip type resistor 4B-1 has the small electric power consumption not more than 0.5 W while having the high heat-resistant temperatures of about 125 or 155° C.

The non-heat generating component 5 can also be divided into a low heat-resistance non-heat generating component 5A and a high heat-resistance non-heat generating component 5B according to the difference of the heat-resistant limitation temperature. For the power supply circuit, an aluminum electrolytic capacitor 5A-1 can be cited as an example of the low heat-resistance non-heat generating component 5A. Although the aluminum electrolytic capacitor 5A-1 has the heat-resistant temperature of 85 or 105° C., it is necessary that the aluminum electrolytic capacitor 5A-1 be used in a low temperature environment. For the power supply circuit, a chip type capacitor 5B-1 can be cited as an example of the high heat-resistance non-heat generating component 5B. The chip type capacitor 5B-1 has the heat-resistant temperature of 85 or 125° C., and it is not necessary that the chip type capacitor 5B-1 be used in a low temperature environment.

In the mounting components except for the transformer 4A-1, the transistor 4A-2 or LSI circuit 4A-3, the chip type resistor 4B-1, and the aluminum electrolytic capacitor 5A-1 or chip type capacitor 5B-1 are previously mounted on the circuit pattern of the lead frame board 1 and then encapsulated by the resin layer 2. After the transformer 4A-1 is encapsulated in the lead frame board 1 by the resin layer 2, the transformer 4A-1 is mounted on the circuit pattern using a through hole 6.

A later-mentioned component mounting surface 1A of the lead frame board 1 can be divided into a low heat-resistance heat generating component mounting region 7, a high heat-resistance heat generating component mounting region 8, and non-heat generating component mounting region 9. The low heat-resistance heat generating component 4A such as the transformer 4A-1, the transistor 4A-2, and the LSI circuit 4A-3 are mounted on the low heat-resistance heat generating component mounting region 7. The high heat-resistance heat generating component 4B such as the chip type resistor 4B-1 is mounted on the high heat-resistance heat generating component mounting region 8. The non-heat generating component 5 such as the aluminum electrolytic capacitor 5A-1 and the chip type capacitor 5B-1 is mounted on the non-heat generating component mounting region 9.

In the low heat-resistance heat generating component mounting region 7, the resin layer 2 is configured by forming a radiation member layer 10 made of a resin having the relatively high thermal conductivity. In the high heat-resistance heat generating component mounting region 8 and the non-heat generating component mounting region 9, the resin layer 2 is configured by forming a heat block member layer 11 made of a resin having the relatively low thermal conductivity.

In the above configuration, most of the heat generated from the transformer 4A-1, transistor 4A-2, and LSI circuit 4A-3 which are of the low heat-resistance heat generating component 4A is radiated by diffusing the heat into the radiation member layer 10 made of the resin having the relatively high thermal conductivity. Accordingly, the radiation member layer 10 acts as a heat block wall to the chip type resistor 4B-1 and non-heat generating component 5 which are of the high heat-resistance heat generating component on the lead frame board 1, particularly to the aluminum electrolytic capacitor 5A-1 which is of the low heat-resistance non-heat generating component 5A. The heat block wall blocks the heat generated by the low heat-resistance heat generating component 4A. the small part of the heat generated by the low heat-resistance heat generating component 4A is transferred to the lead frame board 1, the heat transferred to the lead frame board 1 can efficiently be radiated by inducing the heat to the point such as a later-mentioned electronic device housing where the heat has no influence on the neighbors, and particularly the heat has no influence on the low heat-resistance non-heat generating component 5A such as the aluminum electrolytic capacitor 5A-1.

The heat block member layer 11 also performs the heat block between the high heat-resistance heat generating component mounting region 8 and the low heat-resistance heat generating component mounting region 7 in the lead frame board 1. The heat block member layer 11 can protect the low heat-resistance heat generating component 4A such as transformer 4A-1, the transistor 4A-2, and the LSI circuit 4A-3 such that the heat generated by the high heat-resistance heat generating component 4B such as the chip type resistor 4B-1 has no influence on the low heat-resistance heat generating component 4A.

The heat block member layer 11 also performs the heat block between the non-heat generating component mounting region 9 and the low heat-resistance heat generating component mounting region 7 in the lead frame board 1. The heat block member layer 11 can protect the non-heat generating component 5 such that the heat generated by the low heat-resistance heat generating component 4A such as the transformer 4A-1, the transistor 4A-2, and the LSI circuit 4A-3 has no influence on the non-heat generating component 5, particularly on the low heat-resistance non-heat generating component 5A such as the aluminum electrolytic capacitor 5A-1.

Thus, in the embodiment of the invention, the component mounting board structure is configured as shown in Table 1.

TABLE 1

|  | Heat generating component (4) | Non-heat generating component (5) |
|---|---|---|
| Low heat-resistance component (component having strict temperature limitation) | Low heat-resistance heat generating component (4A), transformer (4A-1), transistor (4A-2), LSI circuit (4A-3) | Low heat-resistance non-heat generating component (5A), aluminum electrolytic capacitor (5A-1) |
| High heat-resistance component (component having not-restricted temperature limitation) | High heat-resistance heat generating component (4B), chip type resistor (4B-1) | High heat-resistance non-heat generating component (5B), chip type capacitor (5B-1) |

That is, the mounting component mounted on the lead frame board 1 is divided into the heat generating component 4 and the non-heat generating component 5, and the heat generating component 4 and the non-heat generating component 5 are further divided into the low heat-resistance heat generating component 4A, the high heat-resistance heat generating component 4B, the low heat-resistance non-heat generating component 5A, and the high heat-resistance non-heat generating component 5B according the difference of the heat-resistant limitation temperature respectively. The radiation member layer 10 efficiently radiates the heat generated by the low heat-resistance heat generating component 4A, and particularly the radiation member layer 10 protects the low heat-resistance non-heat generating component 5A from the heat generated by the low heat-resistance heat generating component 4A and low heat-resistance heat generating component 4A. At the same time, the heat block member layer 11 particularly protects the low heat-resistance heat generating component 4A such that the heat generated by the high heat-resistance heat generating component 4B has no influence on the low heat-resistance heat generating component 4A.

Accordingly, the heat block walls are formed among the low heat-resistance heat generating component 4A, the high heat-resistance heat generating component 4B, and the low heat-resistance non-heat generating component 5A. The heat block member layer 11 performs the heat block among the high heat-resistance heat generating component 4B, the low heat-resistance non-heat generating component 5A, and the high heat-resistance non-heat generating component 5B. The heat block walls made of the resins having the different thermal conductivities may perform the heat block between the high heat-resistance heat generating component 4B and the low heat-resistance non-heat generating component 5A and between the high heat-resistance heat generating component 4B and the high heat-resistance non-heat generating component 5B.

On the basis of the above thought, there are five patterns as the embodiment of the invention.

(1) In the lead frame board 1, the case where the radiation member layer 10 is formed only in the low heat-resistance heat generating component mounting region where the low heat-resistance heat generating component 4A is mounted, (2) In the lead frame board 1, the case where the heat block member layer 11 is formed in the high heat-resistance heat generating component mounting region where the high heat-resistance heat generating component 4B is mounted, the low heat-resistance non-heat generating component mounting region where the low heat-resistance non-heat generating component 5A is mounted, and the high heat-resistance non-heat generating component mounting region where the high heat-resistance non-heat generating component 5B is mounted, while the radiation member layer 10 is formed only in the low heat-resistance heat generating component mounting region where the low heat-resistance heat generating component 4A is mounted, (3) In the lead frame board 1, the case where the heat block member layer 11 is formed in the low heat-resistance non-heat generating component mounting region where the low heat-resistance non-heat generating component 5A is mounted, while the radiation member layer 10 is formed in the low heat-resistance heat generating component mounting region where the low heat-resistance heat generating component 4A is mounted, (4) In the lead frame board 1, the case where the heat block member layer 11 is formed in the low heat-resistance non-heat generating component mounting region where the low heat-resistance non-heat generating component 5A is mounted and the high heat-resistance non-heat generating component mounting region where the high heat-resistance non-heat generating component 5B is mounted, while the radiation member layer 10 is formed in the low heat-resistance heat generating component mounting region where the low heat-resistance heat generating component 4A is mounted and the high heat-resistance heat generating component mounting region where the high heat-resistance heat generating component 4B is mounted, and (5) In the lead frame board 1, the case where the case where the heat block member layer 11 is formed in the low heat-resistance non-heat generating component mounting region where the low heat-resistance non-heat generating component 5A is mounted, while the radiation member layer 10 is formed in the low heat-resistance heat generating component mounting region where the low heat-resistance heat generating component 4A is mounted and the high heat-resistance heat generating component mounting region where the high heat-resistance heat generating component 4B is mounted.

Among the five patterns, in the pattern (1), the radiation member layer 10 can efficiently radiate the heat generated by the low heat-resistance heat generating component 4A such that the heat has no influence on the low heat-resistance non-heat generating component 5A and the high heat-resistance non-heat generating component 5B or the high heat-resistance heat generating component 4B.

In the pattern (2), while the radiation member layer 10 can efficiently radiate the heat generated by the low heat-resistance heat generating component such that the heat has no influence on the low heat-resistance non-heat generating component 5A and the high heat-resistance non-heat generating component 5B or the high heat-resistance heat generating component 4B, the heat block member layer 11 can block the excessive heat which cannot be radiated by the radiation member layer 10 such that the heat has no influence on the low heat-resistance non-heat generating component and the high heat-resistance non-heat generating component or the high heat-resistance heat generating component.

In the pattern (3), while the radiation member layer 10 can efficiently radiate the heat generated by the low heat-resistance heat generating component 4A such that the heat has no influence on the low heat-resistance non-heat generating component 5A or the high heat-resistance non-heat generating component 5B, the heat block member layer 11 can block the excessive heat which cannot be radiated by the radiation member layer 10 such that the heat has no influence on the low heat-resistance non-heat generating component 5A.

In the pattern (4), while the radiation member layer 10 can efficiently radiate the heat generated by the low heat-resistance heat generating component 4A and the high heat-resistance heat generating component 4B such that the heat has no influence on the low heat-resistance non-heat generating component 5A and the high heat-resistance non-heat generating component 5B, the heat block member layer 11 can block the excessive heat which cannot be radiated by the radiation member layer 10 such that the heat has no influence on the low heat-resistance non-heat generating component 5A and the high heat-resistance non-heat generating component 5B.

In the pattern (5), while the radiation member layer 10 can efficiently radiate the heat generated by the low heat-resistance heat generating component 4A and the high heat-resistance heat generating component 4B in the wide area such that the heat has no influence on the low heat-resistance non-heat generating component 5A and the high heat-resistance non-heat generating component 5B, the heat block member layer 11 can block the excessive heat which cannot be radiated by the radiation member layer 10 such that the heat has no influence on the low heat-resistance non-heat generating component 4A.

In the embodiment of the invention, the five patterns are applied to the lead frame board 1. However, the five patterns can also be applied to other component mounting boards such as a printed wiring board.

The radiation member layer 10 is made of the resin having the high thermal conductivity, e.g., a material in which a thermal conductive filler such as aluminum or silica is included in the resin having the thermal conductivity of 0.8 to 6.0 W/m·K in order to increase the thermal conductivity.

The heat block member layer 11 is made of the resin having the low thermal conductivity, e.g., a material in which the thermal conductive filler is hardly included or not included in the resin having the thermal conductivity of 0.1 to 0.8 W/m·K.

Then, Examples of the invention will be described.

EXAMPLE 1

Example 1 Shown in FIG. 2 will be Described Below.

Figure 2:
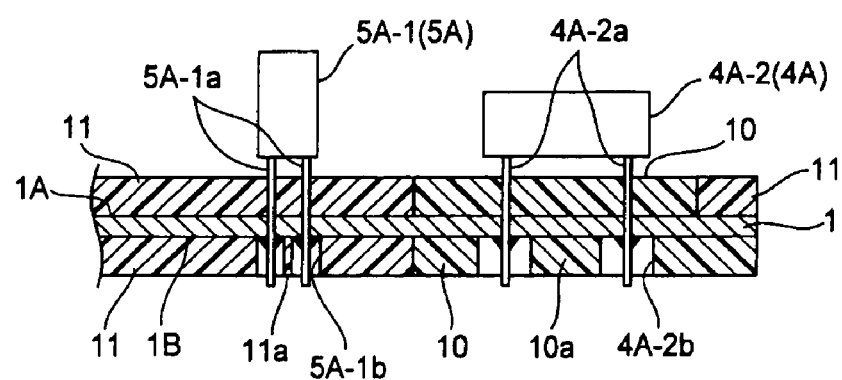
FIG. 2 shows a sectional view taken on line A-A of FIG. 1 in Example 1 of the invention.

Referring to FIG. 2, the transistor 4A-2 which is of the low heat-resistance heat generating component 4A and the aluminum electrolytic capacitor 5A-1 which is of the low heat-resistance non-heat generating component 5A are mounted in the lead frame board 1. The resin layer 2 is configured by forming the radiation member layer 10 made of the resin having the relatively high thermal conductivity in the low heat-resistance heat generating component mounting region 7 where the transistor 4A-2 is mounted in the component mounting surface 1A and the backside 1B of the lead frame board 1. The resin layer 2 is also configured by forming the heat block member layer 11 made of the resin having the relatively high thermal conductivity in the non-heat generating component mounting region 9 (or high heat-resistance heat generating component mounting region 8) where the aluminum electrolytic capacitor 5A-1 is mounted in the component mounting surface 1A and the backside 1B of the lead frame board 1.

The radiation member layer 10 and the heat block member layer 11 are brought into contact with each other without gap at end portions thereof.

Lead foot pieces 4A-2a of the transistor 4A-2 are closely inserted into the radiation member layer 10 on the side of the component mounting surface 1A of the lead frame board 1, front end portions of the lead foot pieces 4A-2a are positioned in a hole portion 4A-2b made in the radiation member layer 10 of the backside 1B of the lead frame board 1, and a part 10a of the radiation member layer 10 intrudes in the hole portion 4A-2b.

Lead foot pieces 5A-1a of the aluminum electrolytic capacitor 5A-1 (or chip type capacitor 5B-1) are closely inserted into the heat block member layer 11 on the side of the component mounting surface 1A of the lead frame board 1, front end portions of the lead foot pieces 5A-1a are positioned in a hole portion 5A-1b made in the heat block member layer 11 of the backside 1B of the lead frame board 1, and a part 11a of the heat block member layer 11 intrudes in the hole portion 5A-1b.

In the above configuration, most of the heat generated from the transistor 4A-2 which is of the low heat-resistance heat generating component 4A is radiated by diffusing the heat into the whole of the radiation member layer 10 made of the resin having the relatively high thermal conductivity.

Accordingly, the radiation member layer 10 acts as the heat block wall to the aluminum electrolytic capacitor 5A-1 which is of the low heat-resistance non-heat generating component 5A on the lead frame board 1. The heat block wall blocks the heat generated by the transistor 4A-2. Although the small part of the heat generated by the transistor 4A-2 is transferred to the lead frame board 1, the heat transferred to the lead frame board 1 can efficiently be radiated by inducing the heat to the point such as the later-mentioned electronic device housing where the heat has no influence on the neighbors, and particularly the heat has no influence on the low heat-resistance non-heat generating component 5A such as the aluminum electrolytic capacitor 5A-1.

In Example 1, in the case where the chip type resistor 4B-1 which is of the high heat-resistance heat generating component 4B is mounted instead of the aluminum electrolytic capacitor 5A-1, because the heat block member layer 11 performs the heat block between the high heat-resistance heat generating component mounting region 8 and the low heat-resistance heat generating component mounting region 7 in the lead frame board 1, the heat block member layer 11 can protect the transistor 4A-2 such that the heat generated by the chip type resistor 4B-1 which is of the high heat-resistance heat generating component 4B has no influence on the transistor 4A-2 which is of the low heat-resistance heat generating component 4A.

EXAMPLE 2

Figure 3:
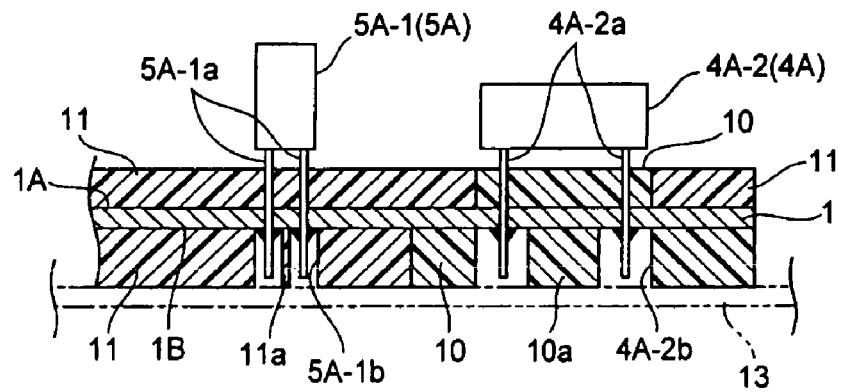
FIG. 3 shows a sectional view taken on line A-A of FIG. 1 in Example 2 of the invention.

FIG. 3 Shows Example 2 of the Invention.

Example 2 is a modification of Example 1. Example 2 differs from Example 1 in that thicknesses of the radiation member layer 10 and heat block member layer 11 are increased such that the lead foot pieces 4A-2a of the transistor 4A-2 or the lead foot pieces 5A-1a of the aluminum electrolytic capacitor 5A-1 are not projected from lower surfaces of the radiation member layer 10 and heat block member layer 11 and the lower surfaces of the radiation member layer 10. Example 2 also differs from Example 1 in that the lower surfaces of the radiation member layer 10 and heat block member layer 11 are brought into close contact with an electronic device housing 13. The electronic device housing 13 also exerts the radiation function to achieve the efficient radiation.

In the case where the heat transfer is obstructed due to the incomplete contact caused by surface roughness or warpage of the radiation member layer 10, the heat block member layer 11, and the electronic device housing 13, the gap can be filled to perform the smooth heat transfer by applying and interposing a gel having a good thermal conductivity among the radiation member layer 10, the heat block member layer 11, and the electronic device housing 13.

EXAMPLE 3

Figure 4:
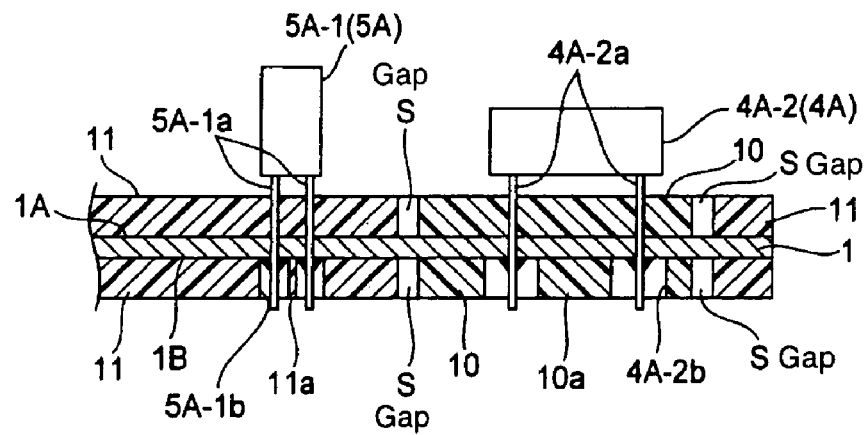
FIG. 4 shows a sectional view taken on line A-A of FIG. 1 in Example 3 of the invention.

FIG. 4 Shows Example 3 of the Invention.

Example 1 has a configuration in which the end portions of the radiation member layer 10 and heat block member layer 11 are bright into contact with each other without gap. On the contrary, Example 3 shown in FIG. 4 differs from Example 1 in that the end portions of the radiation member layer 10 and heat block member layer 11 are separated from each other with a gap S. Other configurations of Example 3 are similar to those of Example 1.

In the configuration of Example 3, the heat block can securely be performed between the radiation member layer 10 and the heat block member layer 11 by forming the gap S between the radiation member layer 10 and the heat block member layer 11 on the lead frame board 1. Therefore, the transistor 4A-2 can be protected such that the heat generated by the chip type resistor 4B-1 which is of the high heat-resistance heat generating component 4B has no influence on the transistor 4A-2 which is of the low heat-resistance heat generating component 4A.

EXAMPLE 4

Figure 5:
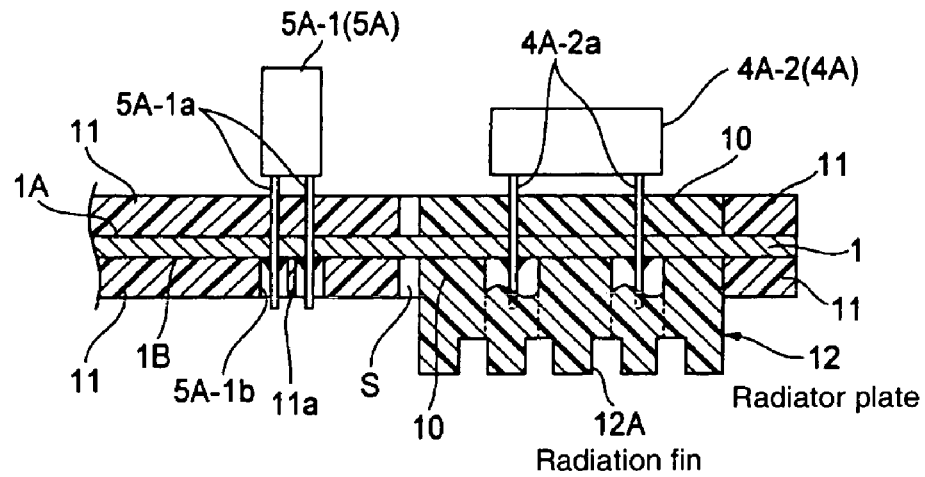
FIG. 5 shows a sectional view taken on line A-A of FIG. 1 in Example 4 of the invention.

FIG. 5 Shows Example 4 of the Invention.

As shown in FIG. 5, Example 4 is a modification of Example 3. Example 4 differs from Example 2 in that a radiator plate 12 having a radiation fin 12A is integrally formed with the radiation member layer 10 provided on the backside 1B of the lead frame board 1, the lead foot pieces 4A-2a of the transistor 4A-2 are surrounded in the radiator plate 12, and thereby the hole portion 4A-2b is eliminated. Other configurations of Example 4 are similar to those of Example 2.

The radiator plate 12 is configured to have the surface area according to the heat generating amount of transistor 4A-2.

In this regard, the surface area is similarly selected in a radiator plate (not shown) for low heat-resistance heat generating component 4A except for the transistor 4A-2.

According to Example 4, the heat transferred to the radiation member layer 10 from the transistor 4A-2 which is of the low heat-resistance heat generating component 4A is radiated by the radiation member layer 10 in itself, and the heat is radiated in air through the radiator plate 12 provided corresponding to the radiation member layer 10, so that the higher radiation effect is obtained.

In the configuration of Example 4, the high radiation effect is obtained because the surface area of the radiator plate 12 is selected according to the heat generating amount of low heat-resistance heat generating component 4A such as the transistor 4A-2.

In the configuration of Example 4, the heat of the low heat-resistance heat generating component 4A such as the transistor 4A-2 is radiated by the radiation member layer 10 in itself, the radiation area is further increased by the radiation fin 12A provided in the radiator plate 12, and the heat is radiated in air through the radiation fin 12A, so that the higher radiation effect is obtained.

In Example 4, because the radiator plate 12 is integrally formed with the radiation member layer 10, the radiator plate 12 can simultaneously be formed in a process of forming the radiation member layer 10 on the lead frame board 1, which contributes to the improvement of the productivity. However, the invention is not limited to Example 4, the separately formed radiator plate 12 may be attached to the radiation member layer 10.

EXAMPLE 5

Figure 6:
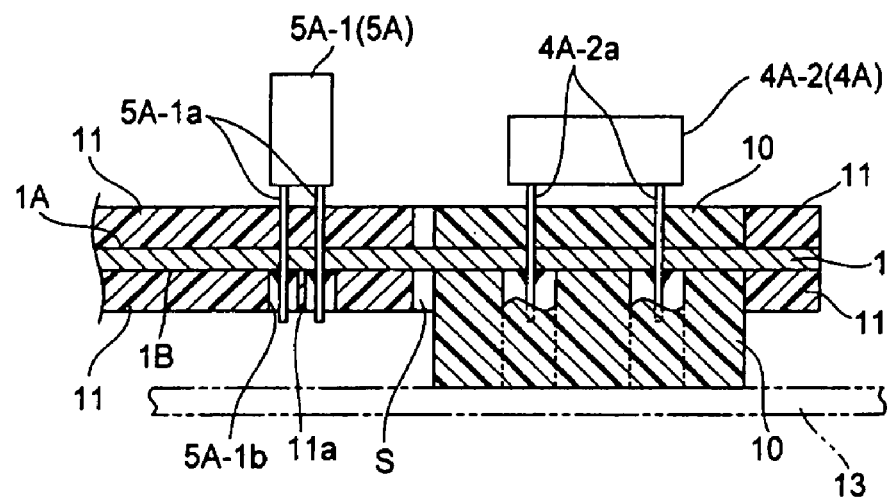
FIG. 6 shows a sectional view taken on line A-A of FIG. 1 in Example 5 of the invention.

FIG. 6 Shows Example 5 of the Invention.

In Example 5, the thickness of the radiation member layer 10 in Example 3 is increased, and the radiation member layer 10 is placed so as to be brought into close contact with the electronic device housing 13 accommodating the lead frame board 1. Other configurations of Example 5 are similar to those of Example 2.

The configuration of Example 5 exerts the function of diffusing the heat transferred to the radiation member layer 10 through the electronic device housing 13 having the large heat capacity, so that the heat generated by the transistor 4A-2 which is of the low heat-resistance heat generating component 4A can be radiated by efficiently inducing the heat through the electronic device housing 13 to the point where the heat has no influence on the neighbors.

EXAMPLE 6

Figure 7:
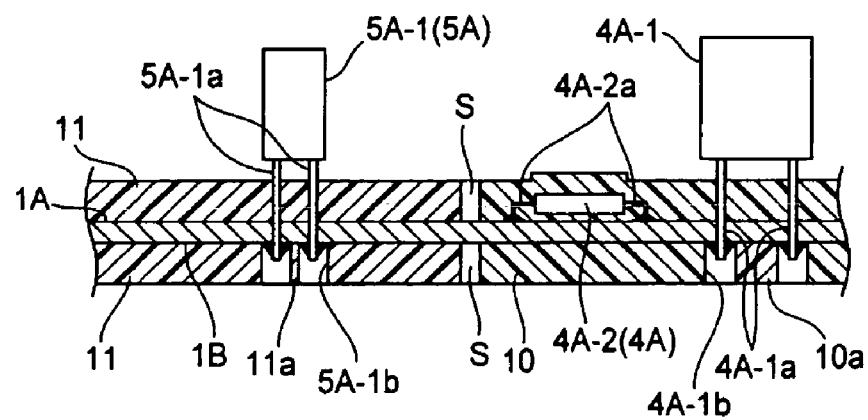
FIG. 7 shows a sectional view taken on line A-A of FIG. 1 in Example 6 of the invention.

FIG. 7 Shows Example 6 of the Invention.

In Example 6 shown in FIG. 7, the transformer 4A-1 and transistor 4A-2 which are of the low heat-resistance heat generating component 4A and the aluminum electrolytic capacitor 5A-1 which is of the low heat-resistance non-heat generating component 5A are mounted on the lead frame board 1. The resin layer 2 is configured by forming the radiation member layer 10 made of the resin having the relatively high thermal conductivity in the low heat-resistance heat generating component mounting region 7 where the transformer 4A-1 and the transistor 4A-2 are mounted in the component mounting surface 1A and the backside 1B of the lead frame board 1. The resin layer 2 is configured by forming the heat block member layer 11 made of the resin having the relatively high thermal conductivity in the non-heat generating component mounting region 9 (or high heat-resistance heat generating component mounting region 8) where the aluminum electrolytic capacitor 5A-1 is mounted in the component mounting surface 1A and the backside 1B of the lead frame board 1.

The end portions of the radiation member layer 10 and heat block member layer 11 are arranged in the component mounting surface 1A and the backside 1B of the lead frame board 1 so as to be separated from each other with the gap S.

Lead foot pieces 4A-1a of the transformer 4A-1 intrude in the radiation member layer 10 on the component mounting surface 1A, and the lead foot pieces 4A-1a are inserted into the lead frame board 1. The front end portions of the lead foot pieces 4A-1a are positioned in a hole portion 4A-1b made in the backside 1B of the radiation member layer 10 of the lead frame board 1, and the radiation member layer 10a intrudes also in the hole portion 4A-1b.

The whole of the transistor 4A-2 which is of a surface mounting component is sealed by the radiation member layer 10. The lead foot pieces 4A-2a intrude in the radiation member layer 10, and the lead foot pieces 4A-2a are mounted on the side of the component mounting surface 1A.

A portion above the transistor 4A-2 is formed so as to be slightly projected from the upper surface of the radiation member layer 10.

Lead foot pieces 5A-1a of the aluminum electrolytic capacitor 5A-1 (or chip type capacitor 5B-1) intrude in the heat block member layer 11 on the component mounting surface 1A, and the lead foot pieces 5A-1a are inserted into the lead frame board 1. The front end portions of the lead foot pieces 5A-1a are positioned in a hole portion 5A-1b made in the backside 1B of the heat block member layer 11 of the lead frame board 1, and the heat block member layer 11a intrudes also in the hole portion 5A-1b.

In the above configuration, most of the heat generated from the transistor 4A-2 which is of the low heat-resistance heat generating component 4A is radiated by diffusing the heat into the whole of the radiation member layer 10 made of the resin having the relatively high thermal conductivity.

Accordingly, the radiation member layer 10 acts as the heat block wall to the aluminum electrolytic capacitor 5A-1 which is of the low heat-resistance non-heat generating component 5A on the lead frame board 1. The heat block wall blocks the heat generated by the transformer 4A-1 or the transistor 4A-2. Although the small part of the heat generated by the transformer 4A-1 or transistor 4A-2 is transferred to the lead frame board 1, the heat transferred to the lead frame board 1 can efficiently be radiated by inducing the heat to the point such as the later-mentioned electronic device housing where the heat has no influence on the neighbors, and the heat block member layer 11 blocks the heat generated by the transformer 4A-1 or the transistor 4A-2. Therefore, the heat has no influence on the low heat-resistance non-heat generating component such as the aluminum electrolytic capacitor 5A-1.

In Example 6, the radiation effect can further be enhanced by performing the resin encapsulation to the whole of the transistor 4A-1 with the radiation member layer 10.

In Example 6, the heat block can securely be performed between the radiation member layer 10 and the heat block member layer 11 by forming the gap S between the radiation member layer 10 and the heat block member layer 11 on the lead frame board 1. Therefore, the transformer 4A-1 or the transistor 4A-2 can be protected such that the heat generated by the chip type resistor 4B-1 which is of the high heat-resistance heat generating component 4B has no influence on the transformer 4A-1 or transistor 4A-2 which is of the low heat-resistance heat generating component 4A.

EXAMPLE 7

Figure 8:
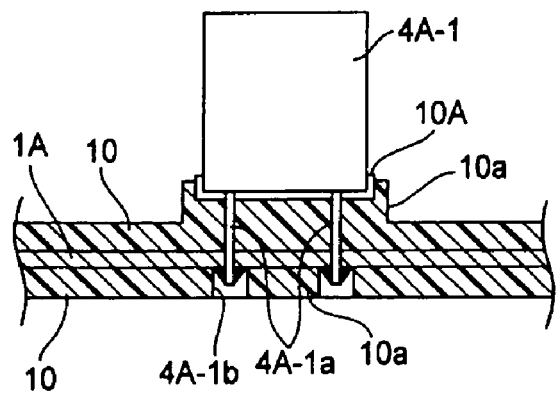
FIG. 8 shows a sectional view showing a main part in Example 7 of the invention.

FIG. 8 shows Example 7 of the invention. In Example 7, the transformer 4A-1 is mounted so as to be brought into close contact with the radiation member layer 10.

Referring to FIG. 8 showing Example 7, similarly to Example 5, the front end portions of the lead foot pieces 4A-1a of the transformer 4A-1 are positioned in the hole portion 4A-1b made in the radiation member layer 10 of the backside 1B of the lead frame board 1, and the radiation member layer 10a intrudes in the hole portion 4A-1b.

In Example 7, in the case where the transformer 4A-1 is mounted on the lead frame board 1 through the radiation member layer 10, the transformer 4A-1 is configured such that a part of the transformer 4A-1 is embedded in a projection portion 10a of the radiation member layer 10 through a radiation gel layer 10A.

In the configuration of Example 7, because the transformer 4A-1 is embedded in the radiation member layer 10 through the radiation gel layer 10A, the transformer 4A-1 is brought into close contact with the radiation member layer 10.

When compared with the case where the main body side of the transformer 4A-1 is not brought into contact with the radiation member layer 10 like Example 6 shown in FIG. 7, the transformer 4A-1 is in close contact with the radiation member layer 10 and the radiation gel layer 10A is interposed between the transformer 4A-1 and the radiation member layer 10 in Example 7. Accordingly, the radiation effect performed by the radiation member layer 10 can further be enhanced to the heat generated from the transformer 4A-1.

FIGS. 9 to 13 show Examples 8 to 12 of the invention in which the printed wiring board is used as the component mounting board.

EXAMPLE 8

Figure 9:
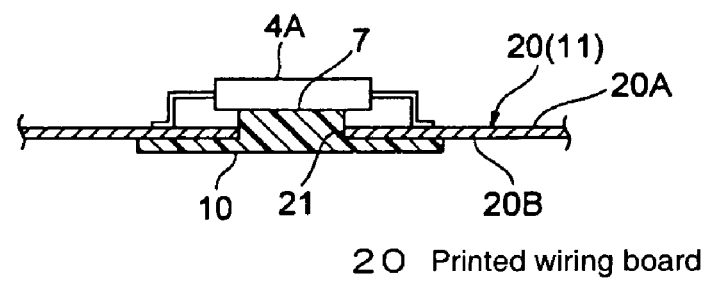
FIG. 9 shows a sectional view showing a main part in Example 8 of the invention when the embodiment of the invention is adopted to a printed wiring board.

According to Example 8 shown in FIG. 9, a printed wiring board 20 is made of the resin having the relatively low thermal conductivity, and thereby the heat block member layer 11 is formed.

A through hole 21 is made in the printed wiring board 20, and the radiation member layer 10 formed on a backside 20B of the printed wiring board 20 is inserted into the through hole 21. The radiation member layer 10 is extended to a component mounting surface 20A of the printed wiring board 20 to form the low heat-resistance heat generating component mounting region 7.

The low heat-resistance heat generating component 4A which is of a surface mounting component is closely mounted on the low heat-resistance heat generating component mounting region 7.

Accordingly, the high heat-resistance heat generating component or non-heat generating component (not shown) is mounted on the component mounting surface 20A where the radiation member layer 10 is not formed in the printed wiring board 20.

According to Example 8, the radiation member layer 10 can diffuse and radiate the heat generated by the low heat-resistance heat generating component 4A on the printed wiring board 20, and particularly the radiation member layer 10 can exert the function as the heat block wall to the low heat-resistance non-heat generating component. The heat block wall blocks the heat generated by the low heat-resistance heat generating component 4A. The radiation member layer 10 can radiate the heat by efficiently inducing the heat to the point such as the electronic device housing where the heat has no influence on the neighbors, and particularly the heat has no influence on the low heat-resistance non-heat generating component on the printed wiring board 20.

The printed wiring board 20 which acts as the heat block member layer performs the heat block between the high heat-resistance heat generating component mounting region and the low heat-resistance heat generating component mounting region which are mounted on the printed wiring board 20. The printed wiring board 20 can protect the low heat-resistance heat generating component 4A such that the heat generated by the high heat-resistance heat generating component has no influence on the low heat-resistance heat generating component 4A.

EXAMPLE 9

Figure 10:
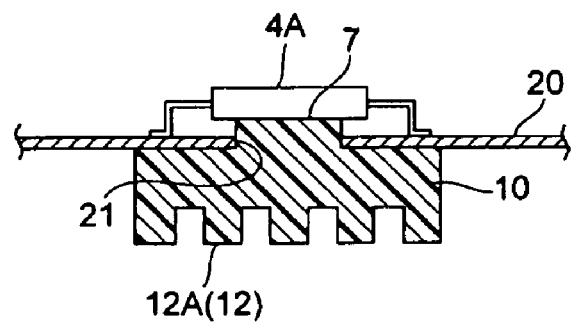
FIG. 10 shows a sectional view showing a main part in Example 9 of the invention when the embodiment of the invention is adopted to the printed wiring board.

According to Example 9 shown in FIG. 10, the radiation area is enlarged by providing the radiation fin 12A in the radiator plate 12 on the backside 20B of the printed wiring board 20 in the radiation member layer 10 of Example 8. The radiator plate 12 can further efficiently radiate the heat generated by the low heat-resistance heat generating component 4A.

EXAMPLE 10

Figure 11:
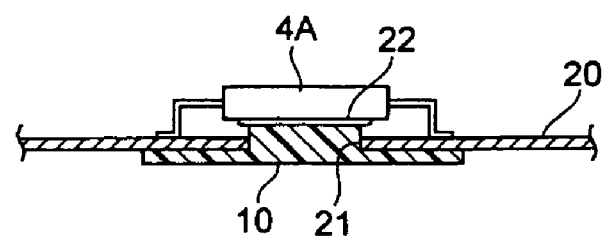
FIG. 11 shows a sectional view showing a main part in Example 10 of the invention when the embodiment of the invention is adopted to the printed wiring board.

According to Example 10 shown in FIG. 11, the radiation member layer 10 and low heat-resistance heat generating component 4A of Example 6 are closely mounted while a thermally conductive adhesive 22 is interposed between the radiation member layer 10 and the low heat-resistance heat generating component 4A. The heat generated by the low heat-resistance heat generating component 4A is transmitted more easily to the radiation member layer 10 to enhance the radiation effect of the radiation member layer 10.

EXAMPLE 11

Figure 12:
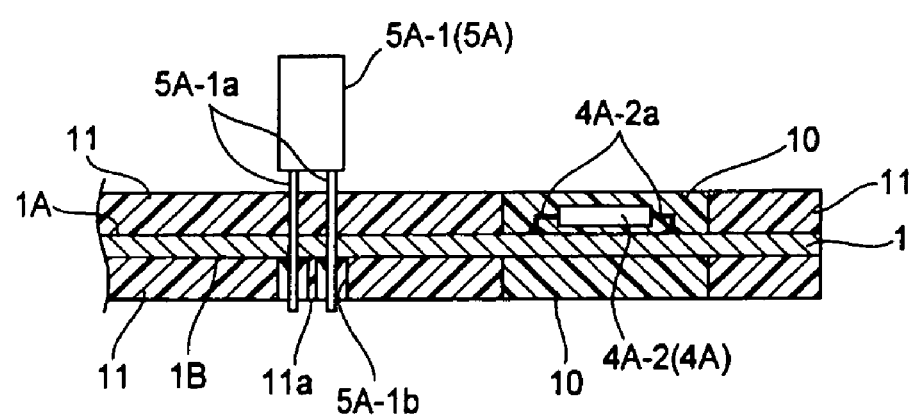
FIG. 12 shows a sectional view showing a main part in Example 11 of the invention when the embodiment of the invention is adopted to the printed wiring board.
Figure 13:
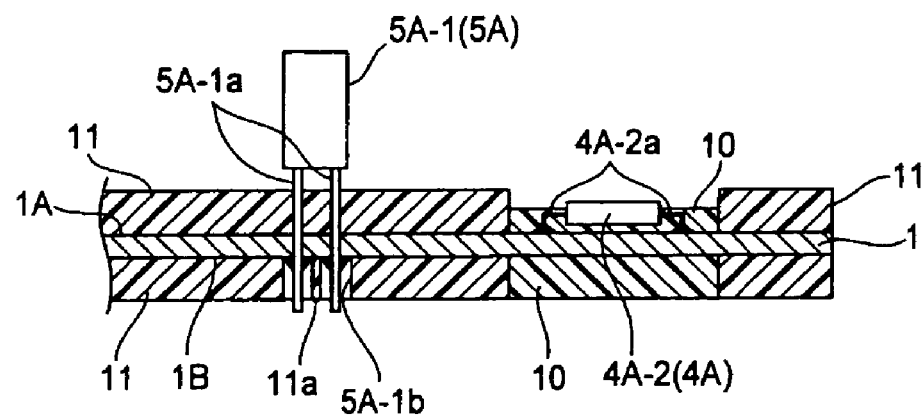
FIG. 13 shows a sectional view showing a main part in Example 12 of the invention when the embodiment of the invention is adopted to the printed wiring board.

Example 11 shown in FIG. 12 is a modification of Example 1 shown in FIG. 2. Similarly to Example 1, the aluminum electrolytic capacitor 5A-1 (or chip type resistor 4B-1) which is of the low heat-resistance non-heat generating component 5A (or high heat-resistance heat generating component 4B) is used as the inserted component. However, in Example 1, the surface mounting component is used as the transistor 4A-2 which is of the low heat-resistance heat generating component 4A.

After the transistor 4A-2 which is of the surface mounting component is surface-mounted on the lead frame board 1, the resin encapsulation is performed to the whole of the transistor 4A-2 with the radiation member layer 10 made of the resin having the relatively high thermal conductivity.

Accordingly, the radiation member layer 10 acts as the heat block wall to the aluminum electrolytic capacitor 5A-1 which is of the low heat-resistance non-heat generating component 5A on the lead frame board 1. The heat block wall blocks the heat generated by the transistor 4A-2. Although the small part of the heat generated by the transistor 4A-2 is transferred to the lead frame board 1, the heat transferred to the lead frame board 1 can efficiently be radiated by inducing the heat to the point such as the later-mentioned electronic device housing where the heat has no influence on the neighbors, and particularly the heat has no influence on the low heat-resistance non-heat generating component 5A such as the aluminum electrolytic capacitor 5A-1.

In Example 11, in the case where the chip type resistor 4B-1 which is of the high heat-resistance heat generating component 4B is mounted instead of the aluminum electrolytic capacitor 5A-1, because the heat block member layer 11 performs the heat block between the high heat-resistance heat generating component mounting region 8 and the low heat-resistance heat generating component mounting region 7 in the lead frame board 1, the heat block member layer 11 can protect the transistor 4A-2 such that the heat generated by the chip type resistor 4B-1 which is of the high heat-resistance heat generating component 4B has no influence on the transistor 4A-2 which is of the low heat-resistance heat generating component 4A.

EXAMPLE 12

In Example 11, the resin encapsulation is performed to the whole of the transistor 4A-2 which is of the surface mounting component by the radiation member layer 10. On the other hand, in Example 12 shown in FIG. 13, the resin encapsulation is performed to the transistor 4A-2 while the surface, e.g., the upper surface of the transistor 4A-2 is exposed.

According to Example 12, not only the heat of the transistor 4A-2 is radiated through the radiation member layer 10, but also the heat is radiated by an air cooling function.

In Examples 11 and 12, the aluminum electrolytic capacitor 5A-1 (or chip type resistor 4B-1) which is of the low heat-resistance non-heat generating component 5A (or high heat-resistance heat generating component 4B) is used as the inserted component. However, the invention is not limited to Examples 11 and 12, but the surface mounting component may be used as the inserted component.

A component mounting board structure production method according to the invention will be described below with reference to FIGS. 14-1 to 16-3.

FIGS. 14-1 and 14-2 show an example of the method of producing Example 1.

As shown in FIG. 14-1, the heat block member layer 11 is previously formed by laminating the resin having the relatively low thermal conductivity on the portion corresponding to the high heat-resistance heat generating component mounting region 8 or the non-heat generating component mounting region 9 in the lead frame board 1 using a technique (not shown). Then, as shown in FIG. 14-2, the radiation member layer 10 is formed by filling and laminating the resin having the relatively low thermal conductivity in the portion corresponding to the low heat-resistance heat generating component mounting region 7 in the lead frame board 1.

In the production method shown in FIGS. 14-1 and 14-2, the heat block member layer 11 is previously laminated on the lead frame board 1, and then the radiation member layer 10 is filled and laminated. However, the invention is not limited to the production method shown in FIGS. 14-1 and 14-2, and the heat block member layer 11 may be formed after the radiation member layer 10 is formed.

Figures 1, 15:
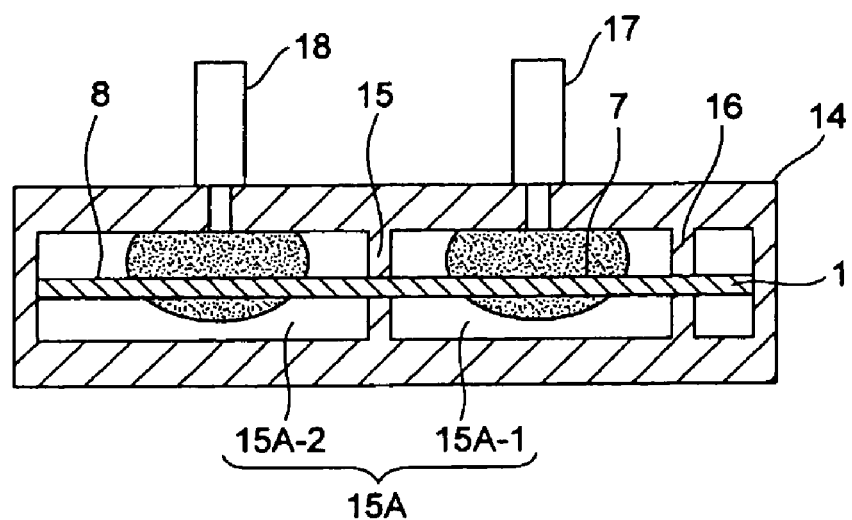
Figures 2, 15:
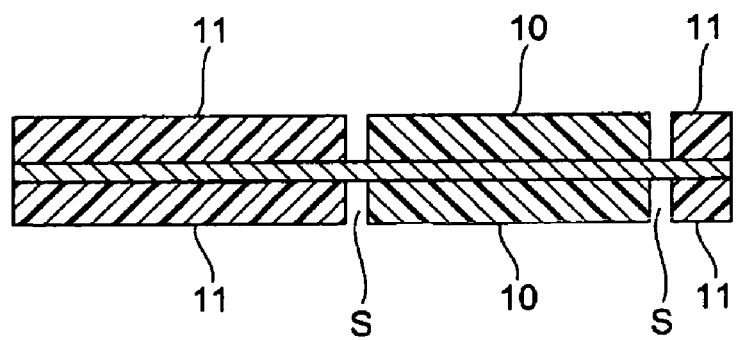

FIGS. 15-1 and 15-2 show an example of the method of producing Example 3.

As shown in FIG. 15-1, while the lead frame board 1 is inserted into a cavity 15A of a metal mold 14, a first compartment cavity 15A-1 and a second compartment cavity 15A-2 are portioned by partitions 15 and 16. The first compartment cavity 15A-1 corresponds to the low heat-resistance heat generating component mounting region 7 in the lead frame board 1, and the second compartment cavity 15A-2 corresponds to the high heat-resistance heat generating component mounting region 8 or the non-heat generating component mounting region 9. The resin having relatively high thermal conductivity is injected from a first molding machine cylinder 17 into the first compartment cavity 15A-1 corresponding to the low heat-resistance heat generating component mounting region 7 in the cavity 15A. At the same time, the resin having relatively low thermal conductivity is injected from a second molding machine cylinder 18 into the second compartment cavity 15A-2 corresponding to the high heat-resistance heat generating component mounting region 8 or the non-heat generating component mounting region 9 in the cavity 15A.

As a result, as shown in FIG. 15-2, the radiation member layer 10 and the heat block member layer 11 are arranged with the gap S on the lead frame board 1.

The invention is not limited to the simultaneous performance of the resin injection process in the first molding machine cylinder 17 and the second molding machine cylinder 18. The resin injection process may not simultaneously be performed in the first molding machine cylinder 17 and the second molding machine cylinder 18.

Figures 1, 16:
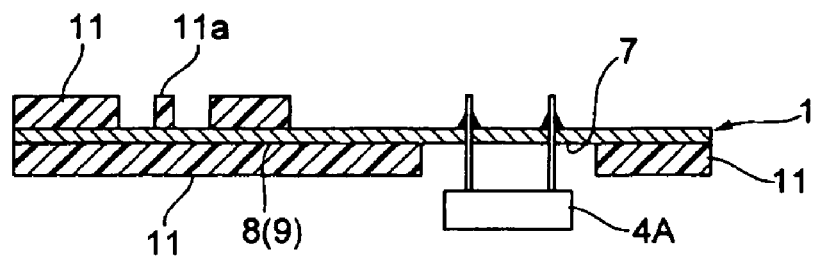
Figures 2, 16:
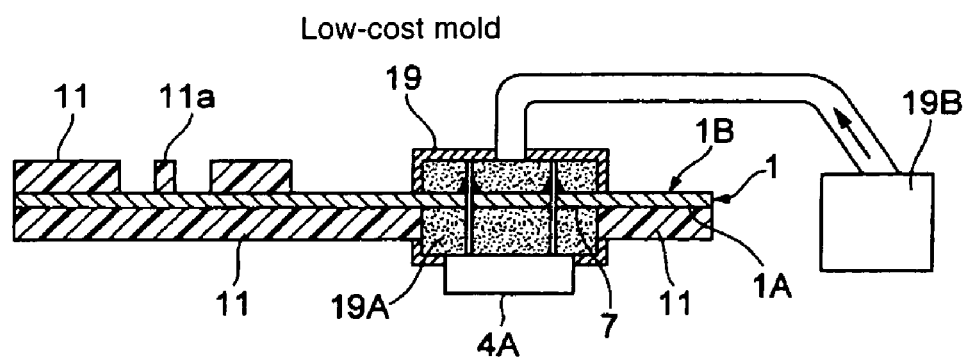
Figures 3, 16:
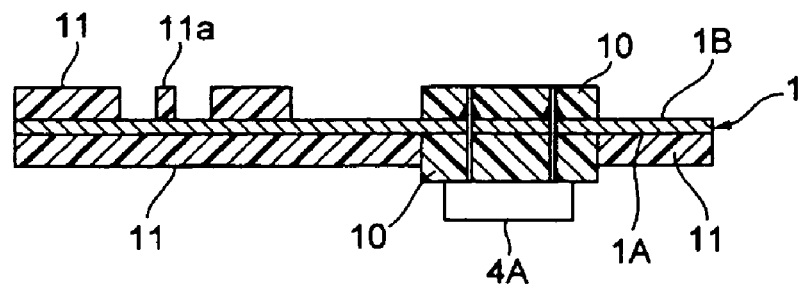

FIGS. 16-1 to 16-3 show an example of a production method in which a low-cost mold is used. The production method shown in FIGS. 16-1 to 16-3 is a modification of the production method shown in FIGS. 14-1 and 14-2.

As shown in FIG. 16-1, while the heat block member layer 11 is previously formed by laminating the resin having the relatively low thermal conductivity on the portion corresponding to the high heat-resistance heat generating component mounting region 8 or the non-heat generating component mounting region 9 in the lead frame board 1 using a technique (not shown), low heat-resistance heat generating component 4A is mounted in the low heat-resistance heat generating component mounting region 7 in the lead frame board 1.

Then, as shown in FIG. 16-2, in order to form a cavity 19A in the portions corresponding to the low heat-resistance heat generating component mounting regions 7 in the component mounting surface 1A and the backside 1B of the lead frame board 1, the low-cost mold 19 is placed closer to the end potion of the heat block member layer 11 on the side of the component mounting surface 1A.

Then, as shown in FIG. 16-3, the radiation member layers 10 are laminated by injecting the resin having the relatively high thermal conductivity into the cavity 19A of the low-cost mold 19 from a molding machine cylinder 19B.

The low-cost mold may be used in the case where the heat block member layer 11 is laminated on the lead frame board 1.

According to the production methods shown in FIGS. 14-1 to 16-3, the versatile radiation structure according to the lead frame board 1 can be produced at low cost and the improvement of the assembling productivity can also be achieved. The production method of the invention can be applied not only to the lead frame board 1 but to the printed wiring board.

The component mounting board structure according to the invention, the heat radiation or the heat block is performed with the resin among the low heat-resistance heat generating component mounting region, the high heat-resistance heat generating component mounting region, the low heat-resistance non-heat generating component mounting region, and the high heat-resistance non-heat generating component mounting region. Therefore, the resin functions as the heat block layer while functioning as the radiation member layer. Although the small part of the heat generated by the low heat-resistance heat generating component 4A is transferred to the component mounting board, the heat transferred to the component mounting board can efficiently be radiated by inducing the heat to the point such as the electronic device housing where the heat has no influence on the neighbors, and particularly the heat has no influence on the low heat-resistance non-heat generating component. The component mounting board structure having the versatile radiation structure according to the component mounting boards such as the printed wiring board and the lead frame board can be produced at low cost, and the assembling productivity can be improved. Therefore, the invention is useful for the component mounting board structure of the electronic device such as the switching regulator and the thermoregulator and the component mounting board structure production method.

What is claimed is:

1. A component mounting board structure, wherein mounting components mounted on a component mounting board are formed by heat generating components having large self-heating characteristics and non-heat generating components having no self-heating characteristic or hardly having self-heating characteristics, the heat generating components are divided into a low heat-resistance heat generating component and a high heat-resistance heat generating component according to heat-resistant limitation temperatures, the non-heat generating components are divided into a low heat-resistance non-heat generating component and a high heat-resistance non-heat generating component according to heat-resistant limitation temperatures, and heat radiation or heat block is performed by interposing resin layers among a low heat-resistance heat generating component mounting region where the low heat-resistance heat generating component is mounted, a high heat-resistance heat generating component mounting region where the high heat-resistance heat generating component is mounted, a low heat-resistance non-heat generating component mounting region where the low heat-resistance non-heat generating component is mounted, and a high heat-resistance non-heat generating component mounting region where the high heat-resistance non-heat generating component is mounted.

2. The component mounting board structure according to claim 1, wherein the low heat-resistance heat generating component is formed by a transistor, a diode, a thermistor, a transformer, and a coil which are of a component having an electric power consumption not lower than 1 W and a low heat-resistant limitation temperature.

3. The component mounting board structure according to claim 1, wherein the high heat-resistance heat generating component is formed by a chip type resistor which is of a component having an electric power consumption not more than 0.5 W and a high heat-resistant limitation temperature.

4. The component mounting board structure according to claim 1, wherein the low heat-resistance non-heat generating component is formed by an aluminum electrolytic capacitor which is of a component having a low heat-resistant limitation temperature, the aluminum electrolytic capacitor being required to be used in a low temperature environment.

5. The component mounting board structure according to claim 1, wherein the high heat-resistance non-heat generating component is formed by a chip type capacitor which is of a component having a high heat-resistant limitation temperature.

6. The component mounting board structure according to claim 1, wherein the resin layer is formed by a radiation member layer and a heat block member layer.

7. The component mounting board structure according to claim 6, wherein the radiation member layer is made of a resin whose thermal conductivity ranges from 0.8 to 6.0 W/mK.

8. The component mounting board structure according to claim 6, wherein the radiation member layer is made of a resin whose thermal conductivity ranges from 1.5 to 6.0 W/mK.

9. The component mounting board structure according to claim 6, wherein the heat block member layer is made of a resin whose thermal conductivity ranges from 0.1 to 0.8 W/mK.

10. The component mounting board structure according to claim 6, wherein the heat block member layer is made of a resin whose thermal conductivity ranges from 0.1 to 0.5 W/mK.

11. The component mounting board structure according to claim 1, wherein a radiation member layer made of a resin having a relatively high thermal conductivity is provided in the low heat-resistance heat generating component mounting region, and the heat radiation or heat block is performed by the radiation member layer among the low heat-resistance heat generating component mounting region, the high heat-resistance heat generating component mounting region, the low heat-resistance non-heat generating component mounting region, and the high heat-resistance non-heat generating component mounting region.

12. The component mounting board structure according to claim 1, wherein a radiation member layer made of a resin having a relatively high thermal conductivity is provided in the low heat-resistance heat generating component mounting region, heat block member layers made of resins having relatively low thermal conductivities are provided in the high heat-resistance heat generating component mounting region, the low heat-resistance non-heat generating component mounting region, and the high heat-resistance non-heat generating component mounting region, and the heat radiation or heat block is performed by the radiation member layer and the heat block member layer among the low heat-resistance heat generating component mounting region, the high heat-resistance heat generating component mounting region, the low heat-resistance non-heat generating component mounting region, and the high heat-resistance non-heat generating component mounting region.

13. The component mounting board structure according to claim 1, wherein a radiation member layer made of a resin having a relatively high thermal conductivity is provided in the low heat-resistance heat generating component mounting region, a heat block member layer made of a resin having a relatively low thermal conductivity is provided in the low heat-resistance non-heat generating component mounting region, and the heat radiation or heat block is performed by the radiation member layer and the heat block member layer among the low heat-resistance heat generating component mounting region, the high heat-resistance heat generating component mounting region, the low heat-resistance non-heat generating component mounting region, and the high heat-resistance non-heat generating component mounting region.

14. The component mounting board structure according to claim 1, wherein radiation member layers made of resins having relatively high thermal conductivities are provided in the low heat-resistance heat generating component mounting region and the high heat-resistance heat generating component mounting region, heat block member layers made of resins having relatively low thermal conductivities are made in the low heat-resistance non-heat generating component mounting region and the high heat-resistance non-heat generating component mounting region, and the heat radiation or heat block is performed by the radiation member layer and the heat block member layer among the low heat-resistance heat generating component mounting region, the high heat-resistance heat generating component mounting region, the low heat-resistance non-heat generating component mounting region, and the high heat-resistance non-heat generating component mounting region.

15. The component mounting board structure according to claim 1, wherein radiation member layers made of resins having relatively high thermal conductivities are provided in the low heat-resistance heat generating component mounting region and the high heat-resistance heat generating component mounting region, a heat block member layer made of a resin having a relatively low thermal conductivity is provided in the low heat-resistance non-heat generating component mounting region, and the heat radiation or heat block is performed by the radiation member layer and the heat block member layer between the low heat-resistance heat generating component mounting region and the high heat-resistance heat generating component mounting region and between the low heat-resistance non-heat generating component mounting region and the high heat-resistance non-heat generating component mounting region.

16. The component mounting board structure as in any one of claims 12 to 15, wherein the radiation member layer and the heat block member layer are arranged on the component mounting board while a gap exists between the radiation member layer and the heat block member layer.

17. The component mounting board structure according to claim 6, wherein the radiation member layer is closely arranged in an electronic device housing which accommodates the component mounting board.

18. The component mounting board structure according to claim 6, wherein a radiator plate which is formed separately from the radiation member layer is provided in a region corresponding to the radiation member layer in the component mounting board.

19. The component mounting board structure according to claim 18, wherein the radiator plate is formed so as to have a surface area according to a heat generating amount of heat generating component.

20. The component mounting board structure according to claim 18, wherein the radiator plate has a radiation fin.

21. The component mounting board structure according to claim 18, wherein the radiator plate is integrally formed with the radiation member layer.

22. A component mounting board structure production method, wherein, in the case where mounting components mounted on a component mounting board are formed by heat generating components having large self-heating characteristics and non-heat generating components having no self-heating characteristic or hardly having self-heating characteristics while the heat generating components are divided into a low heat-resistance heat generating component and a high heat-resistance heat generating component according to heat-resistant limitation temperatures, when the low heat-resistance heat generating component mounting region and high heat-resistance heat generating component mounting region or the non-heat generating component mounting region are formed while heat radiation or heat block is performed by a radiation member layer and a heat block member layer, the radiation member layer made of a resin having a relatively high thermal conductivity being provided in a low heat-resistance heat generating component mounting region where the low heat-resistance heat generating component is mounted in the component mounting board, the heat block member layer made of a resin having a relatively low thermal conductivity being provided in a high heat-resistance heat generating component mounting region where the high heat-resistance heat generating component is mounted or in a non-heat generating component mounting region where the non-heat generating component is mounted in the component mounting board, the radiation member layer is made of the resin having the relatively high thermal conductivity in the low heat-resistance heat generating component mounting region of the component mounting board, and then the heat block member layer is made of the resin having the relatively low thermal conductivity in the high heat-resistance heat generating component mounting region of the component mounting board, and thereby the radiation member layer and the heat block member layer are made on the component mounting board.

23. A component mounting board structure production method, wherein, in the case where mounting components mounted on a component mounting board are formed by heat generating components and non-heat generating components while the heat generating components are divided into a low heat-resistance heat generating component and a high heat-resistance heat generating component according to heat-resistant limitation temperatures, when the low heat-resistance heat generating component mounting region and high heat-resistance heat generating component mounting region or the non-heat generating component mounting region is formed while heat radiation or heat block is performed by a radiation member layer and a heat block member layer, the radiation member layer made of a resin having a relatively high thermal conductivity being provided in a low heat-resistance heat generating component mounting region where the low heat-resistance heat generating component is mounted in the component mounting board, the heat block member layer made of a resin having a relatively low thermal conductivity being provided in a high heat-resistance heat generating component mounting region where the high heat-resistance heat generating component is mounted or in a non-heat generating component mounting region where the non-heat generating component is mounted in the component mounting board, the heat block member layer is made of the resin having the relatively low thermal conductivity in the high heat-resistance heat generating component mounting region of the component mounting board, and then the radiation member layer is made of the resin having the relatively high thermal conductivity in the low heat-resistance heat generating component mounting region of the component mounting board, and thereby the radiation member layer and the heat block member layer are made on the component mounting board.

24. A component mounting board structure production method, wherein, in the case where mounting components mounted on a component mounting board are formed by heat generating components and non-heat generating components while the heat generating components are divided into a low heat-resistance heat generating component and a high heat-resistance heat generating component according to heat-resistant limitation temperatures, when the low heat-resistance heat generating component mounting region and high heat-resistance heat generating component mounting region or the non-heat generating component mounting region is formed while heat radiation or heat block is performed by a radiation member layer and a heat block member layer, the radiation member layer made of a resin having a relatively high thermal conductivity being provided in a low heat-resistance heat generating component mounting region where the low heat-resistance heat generating component is mounted in the component mounting board, the heat block member layer made of a resin having a relatively low thermal conductivity being provided in a high heat-resistance heat generating component mounting region where the high heat-resistance heat generating component is mounted or in a non-heat generating component mounting region where the non-heat generating component is mounted in the component mounting board, the heat block member layer is formed in the high heat-resistance heat generating component mounting region of the component mounting board by injecting the resin having the relatively low thermal conductivity from one of nozzles of a molding machine to the high heat-resistance heat generating component mounting region of the component mounting board, at the same time when the radiation member layer is formed in the low heat-resistance heat generating component mounting region of the component mounting board by injecting the resin having the relatively high thermal conductivity from the other nozzle of the molding machine to the low heat-resistance heat generating component mounting region of the component mounting board.

25. A component mounting board structure production method, wherein, in the case where mounting components mounted on a component mounting board are formed by heat generating components and non-heat generating components while the heat generating components are divided into a low heat-resistance heat generating component and a high heat-resistance heat generating component according to heat-resistant limitation temperatures, when the low heat-resistance heat generating component mounting region and high heat-resistance heat generating component mounting region or the non-heat generating component mounting region is formed while heat radiation or heat block is performed by a radiation member layer and a heat block member layer, the radiation member layer made of a resin having a relatively high thermal conductivity being provided in a low heat-resistance heat generating component mounting region where the low heat-resistance heat generating component is mounted in the component mounting board, the heat block member layer made of a resin having a relatively low thermal conductivity being provided in a high heat-resistance heat generating component mounting region where the high heat-resistance heat generating component is mounted or in a non-heat generating component mounting region where the non-heat generating component is mounted in the component mounting board, after at least one of the low heat-resistance heat generating component mounting regions is surrounded by a low-cost mold, the radiation member layer is formed by filling the low heat-resistance heat generating component mounting region with the resin having the relatively high thermal conductivity.

* * * * *

UNITED STATES PATENT AND TRADEMARK OFFICE
CERTIFICATE OF CORRECTION

PATENT NO. : 7,663,891 B2  Page 1 of 1
APPLICATION NO. : 11/431097
DATED : February 16, 2010
INVENTOR(S) : Tanaka et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 952 days.

Signed and Sealed this

Thirtieth Day of November, 2010

David J. Kappos
*Director of the United States Patent and Trademark Office*